(12) United States Patent
Nishiyama et al.

(10) Patent No.: US 7,355,824 B2
(45) Date of Patent: *Apr. 8, 2008

(54) MAGNETORESISTIVE EFFECT ELEMENT AND MAGNETIC MEMORY HAVING THE SAME

(75) Inventors: Katsuya Nishiyama, Kanagawa-ken (JP); Yoshiaki Saito, Kanagawa-ken (JP); Minoru Amano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 515 days.

This patent is subject to a terminal disclaimer.

(21) Appl. No.: 10/976,840

(22) Filed: Nov. 1, 2004

(65) Prior Publication Data

US 2005/0088788 A1 Apr. 28, 2005

Related U.S. Application Data

(63) Continuation of application No. 10/395,073, filed on Mar. 25, 2003, now Pat. No. 6,826,078.

(30) Foreign Application Priority Data

Mar. 27, 2002 (JP) .............................. 2002-088827

(51) Int. Cl.
*G11B 5/39* (2006.01)
*G11C 11/00* (2006.01)

(52) U.S. Cl. .............................. 360/324.11; 360/324.2; 428/811.1; 365/158; 365/171

(58) Field of Classification Search ...................... None
See application file for complete search history.

(56) References Cited

U.S. PATENT DOCUMENTS 6,069,820 A 5/2000 Inomata et al.
6,312,840 B1 * 11/2001 Kumagai et al. ......... 428/811.1
6,335,081 B1 * 1/2002 Araki et al. ................. 428/141
6,381,171 B1 4/2002 Inomata et al.
6,522,573 B2 2/2003 Saito et al.
6,590,803 B2 7/2003 Saito et al.
6,597,547 B1 * 7/2003 Kawawake et al. .... 360/324.11

(Continued)

FOREIGN PATENT DOCUMENTS

| JP | 11-168250 | 6/1999 |
|---|---|---|
| JP | 2000-58941 | 2/2000 |
| JP | 2000-188435 | 7/2000 |
| JP | 2001-36164 | 2/2001 |
| JP | 2001-237472 | 8/2001 |
| JP | 2002-25245 | 1/2002 |

OTHER PUBLICATIONS

U.S. Appl. No. 10/976,840, filed Nov. 1, 2004, Nishiyama et al.

*Primary Examiner*—Kevin M. Bernatz
(74) *Attorney, Agent, or Firm*—Oblon, Spivak, McClelland, Maier & Neustadt, P.C.

(57) ABSTRACT

The present invention relates to a magnetoresistive effect element, which has a large MR ratio, excellent thermostability and a small switching magnetic field even if its size is decreased, and a magnetic memory using the magnetoresistive effect element. The magnetoresistive effect element includes: a storage layer formed by stacking a plurality of ferromagnetic layers via non-magnetic layers; a magnetic film having at least one ferromagnetic layer; and a tunnel barrier layer provided between the storage layer and the magnetic film. Each of the ferromagnetic layers of the storage layer is formed of an Ni—Fe—Co ternary alloy. A peak-to-peak maximum surface roughness on each of an interface between the storage layer and the tunnel barrier layer and an interface between the magnetic film and the tunnel barrier layer is 0.4 nm or less.

35 Claims, 14 Drawing Sheets

U.S. PATENT DOCUMENTS 6,724,585 B2 *  4/2004  Hayashi .................. 360/324.2
6,801,414 B2    10/2004 Amano et al.
6,826,078 B2 *  11/2004 Nishiyama et al. ......... 365/158
7,092,224 B2 *  8/2006  Nakashio et al. ........ 360/324.2
2004/0062938 A1  4/2004  Kai et al.
2004/0100855 A1  5/2004  Saito et al.
2004/0175596 A1  9/2004  Inomata et al.
2004/0240123 A1  12/2004 Amano et al.

* cited by examiner

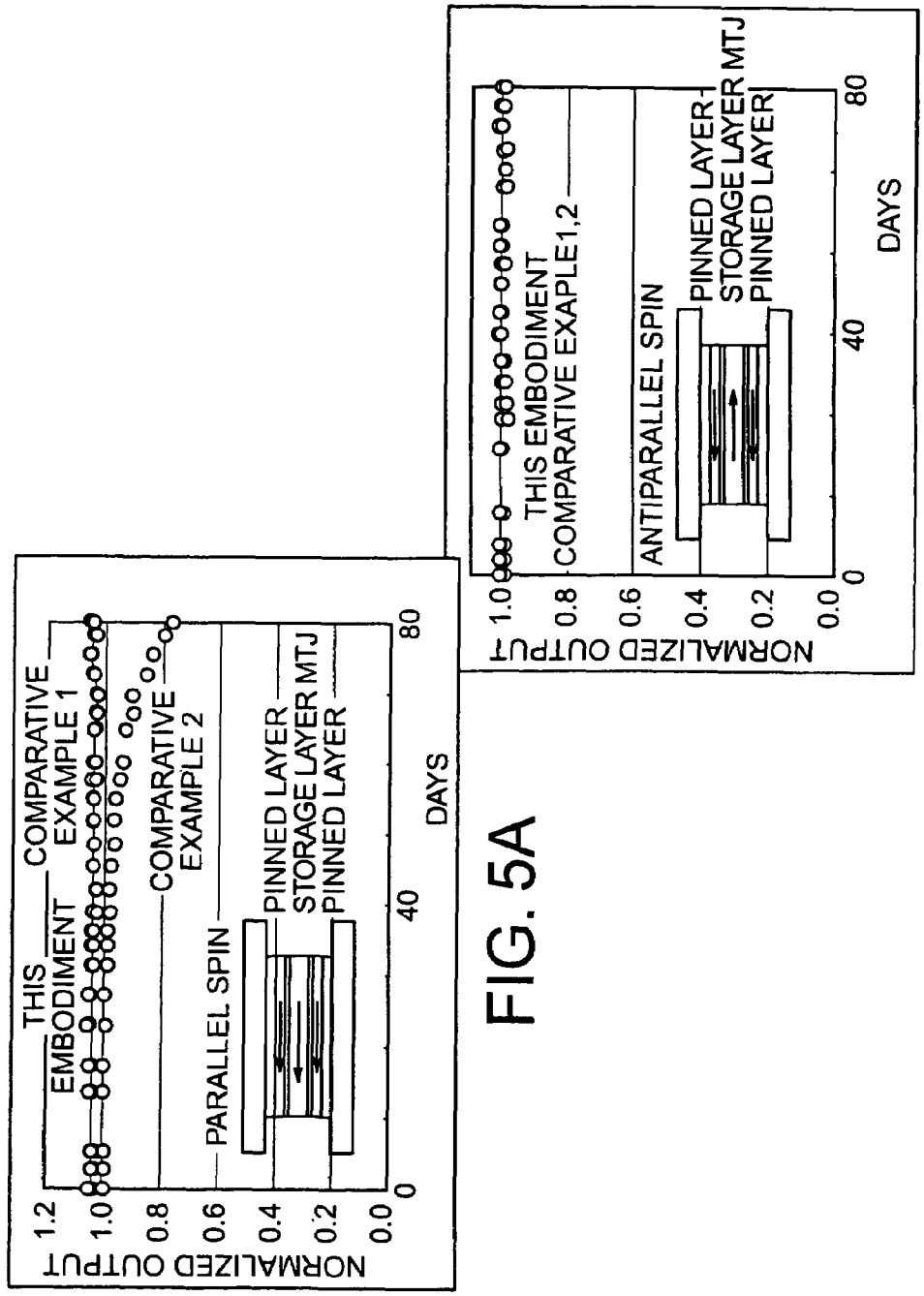

MAGNETORESISTIVE EFFECT ELEMENT AND MAGNETIC MEMORY HAVING THE SAME

CROSS-REFERENCE TO RELATED APPLICATIONS

This application is a Continuation Application of U.S. application Ser. No. 10/395,073, filed Mar. 25, 2003, now U.S. Pat. No. 6,826,078, the contents of which are herein incorporated by reference, and is based upon and claims the benefit of priority from the prior Japanese Patent Application No. 2002-088827, filed Mar. 27, 2002, the entire contents of which are herein incorporated by reference.

BACKGROUND OF THE INVENTION

1. Field of the Invention

The present invention relates to a magnetoresistive effect element and a magnetic memory having the same.

2. Related Art

A magnetoresistive effect element having magnetic films is used for magnetic heads, magnetic sensors and so forth, and proposed to be used for solid magnetic memories. In particular, there is an increasing interest in a magnetic random access memory (which will be also hereinafter referred to as MRAM), which utilizes the magnetoresistive effect of a ferromagnetic substance, as a next generation solid nonvolatile memory capable of carrying out a rapid reading/writing and an operation with large capacity and low power consumption.

In recent years, as a magnetoresistive effect element which has a sandwich structure having one dielectric layer between two magnetic metal layers and which allows a current to pass in a direction perpendicular to the plane of the film and utilizes a tunnel current, a so-called "ferromagnetic tunneling magnetoresistive effect element (which will be also hereinafter referred to as a TMR element)" has been proposed. Since the rate of change in magnetoresistive effect of a ferromagnetic tunneling magnetoresistive effect element reaches 20% or more (see J. Appl. Phys. 79, 4724 (1996)), the possibility that it is applied to MRAMs is enhanced.

This ferromagnetic tunneling magnetoresistive effect element can be realized by depositing a thin Al (aluminum) layer having a thickness of 0.6 to 2.0 nm on a ferromagnetic electrode, and thereafter, exposing the surface thereof to oxygen glow discharge or oxygen gas to form a tunnel barrier layer of $Al_2O_3$.

In addition, there has been proposed a ferromagnetic single tunnel junction having a structure wherein an antiferromagnetic layer is provided so as to contact one ferromagnetic layer forming the ferromagnetic single tunnel junction, so that the exchnage coupling force causes the magnetization inversion of the one ferromagnetic layer to be difficult to occur to form a magnetization fixed layer in which the direction of magnetization is fixed (see Japanese Patent Laid-Open No. 10-4227).

In addition, a ferromagnetic tunnel junction using magnetic particles dispersed in a dielectric, and a ferromagnetic double tunnel junction (continuous layer) have been proposed (Phys. Rev. B58 (10), R5747 (1997), Journal of Applied Magnetic Society 23, 4-2, (1999), Appl. Phys. Lett. 73 (19), 2829 (1998), Jpn. J. Appl. Phys. 39, L1035 (2001)).

Also in these cases, the rate of change in magnetic resistance can be in the range of 20% to 50%, and the decrease of the rate of change in magnetic resistance can be suppressed even if a voltage value applied to the ferromagnetic tunneling magnetoresistive effect element is increased in order to obtain a desired output voltage, so that there is some possibility that they are applied to MRAMs.

If a TMR element is used for an MRAM, a magnetization fixed layer, in which the direction of magnetization of one of two ferromagnetic layers sandwiching a tunnel barrier layer therebetween is fixed, serves as a magnetization reference layer, and a magnetization free layer, in which the direction of magnetization of the other ferromagnetic layer is easy to be inverted, serves as a storage layer. Information can be stored by causing states, in which the directions of magnetization in the reference layer and storage layer are parallel and antiparallel to each other, to correspond to binary information "0" and "1".

Information to be recorded is written by inverting the direction of magnetization in the storage layer by an induction field which is caused by a current passing through a writing line provided in the vicinity of a TMR element. The recorded information is read by detecting a variation of magnetic resistance due to the TRM effect.

In order to fix the direction of magnetization in the reference layer, there is used a method wherein an antiferromagnetic layer is provided so as to contact a ferromagnetic layer so that it is difficult to invert magnetization by the exchnage coupling force. Such a structure is called a spin-valve structure. In this structure, the direction of magnetization in the reference layer is determined by carrying out a heat treatment while applying a magnetic field (a magnetization fixing annealing). On the other hand, the storage layer is formed so that the magnetization easy direction is substantially the same as the direction of magnetization in the reference layer by applying magnetic anisotropy.

The magnetic storage element using the ferromagnetic single tunnel junction or ferromagnetic double tunnel junction has a potential that it is nonvolatile, the writing/reading time is a short time of 10 nanoseconds or less, and the number of capable rewriting operations is $10^{15}$ or more. In particular, the magnetic storage element using the ferromagnetic double tunnel junction can decrease the rate of change in magnetic resistance even if the voltage applied to the ferromagnetic tunneling magnetoresistive effect element to obtain a desired output voltage value is increased, so that it can obtain a high output voltage to have preferred characteristics as a magnetic storage element.

However, with respect to the cell size of the memory, if one transistor-one TMR architecture having a memory cell comprising one transistor and one TMR element (see, e.g. U.S. Pat. No. 5,734,605) is used, there is a problem in that the size can not be smaller than that of a DRAM (Dynamic Random Access Memory) of a semiconductor.

In order to solve this problem, there have been proposed a diode type architecture wherein a TMR element and a diode are connected in series between a bit line and a word line (see U.S. Pat. No. 5,640,343), and a simple matrix type architecture wherein a TMR element is arranged between a bit line and word line (see DE19744095, WO9914760).

However, if the memory capacity is increased and the size of the TMR element is scaled down, there is a problem in that thermal fluctuation occurs, and there is some possibility that spin information disappears. In addition, there is a problem in that the switching magnetic field increases due to the decrease of the size of the TMR element.

The coercive force, i.e. the switching magnetic field, depends on the size and shape of the element, magnetization of the ferromagnetic material, thickness and so forth. In general, if the size of the storage element increases, the switching magnetic field increases. This means that, if the TMR element having the tunnel junction is used for an MRAM as a storage element, a large magnetic field due to current is required, and power consumption increases. Moreover, if high integration is considered, there is a serious problem in that the increase of power consumption is more remarkable.

In addition, there is a problem in long-term thermostability under the influence of diffusion of Mn atom or the like due to heat.

As described above, in order to realize amass storage of a magnetic memory, there is required a magnetoresistive effect element, which has a large MR ratio, a small switching magnetic field and a superior thermostability even if the size of a TMR element is decreased, and a magnetic memory using the same.

SUMMARY OF THE INVENTION

It is therefore an object of the present invention to eliminate the aforementioned problems and to provide a reliable magnetoresistive effect element, which has a large MR ratio, a small switching magnetic field and a superior thermostability even if the size of a ferromagnetic tunneling magnetoresistive effect element is decreased, and a magnetic memory using the same.

According to a first aspect of the present invention, a magnetoresistive effect element includes: a storage layer formed by stacking a plurality of ferromagnetic layers via non-magnetic layers; a magnetic film having at least one ferromagnetic layer; and a tunnel barrier layer provided between the storage layer and the magnetic film, wherein each of the ferromagnetic layers of the storage layer is formed of an Ni—Fe—Co ternary alloy which has a composition selected from one of a composition region surrounded by a straight line of $Co_{90(at\ \%)}Fe_{10(at\ \%)}$—$Fe_{30(at\ \%)}Ni_{70(at\ \%)}$, a straight line of $Fe_{50(at\ \%)}Ni_{20(at\ \%)}$—$Fe_{30(at\ \%)}Ni_{70(at\ \%)}$ and a straight line of $Fe_{80(at\ \%)}Ni_{20(at\ \%)}$—$Co_{65(at\ \%)}Ni_{35(at\ \%)}$, and a composition region surrounded by a straight line of $Fe_{80(at\ \%)}Ni_{20(at\ \%)}$—$Co_{65(at\ \%)}Ni_{35(at\ \%)}$, a straight line of $Co_{90(at\ \%)}Fe_{10(at\ \%)}$—$Fe_{70(at\ \%)}Ni_{30(at\ \%)}$ and a straight line of $Co_{90(at\ \%)}Fe_{10(at\ \%)}$—$Fe_{30(at\ \%)}Ni_{70(at\ \%)}$, and wherein a maximum surface roughness on each of an interface between the storage layer and the tunnel barrier layer and an interface between the magnetic film and the tunnel barrier layer is 0.4 nm or less.

According to a second aspect of the present invention, a magnetic memory includes: first lines; second lines crossing the first lines; memory cells, each of which is provided in a corresponding one of crossing regions between the first line and the second line, wherein each of the memory cells has the above described magnetoresistive effect element as a storage element.

According to a third aspect of the present invention, a magnetic memory includes: a first line; a first magnetoresistive effect element formed above the first line; a second magnetoresistive effect element formed below the first line; a second line crossing the first line formed above the first magnetoresistive effect element; and a third line crossing the first line formed below the second magnetoresistive effect element, wherein each of the first and second magnetoresistive effect element is the above described magnetoresistive effect element, wherein magnetization of a storage layer of each of the first and second magnetoresistive effect element is capable of being inverted in a predetermined direction by causing a current to pass through the first line while causing a current to pass through the second and third lines, and wherein a difference between output signals from the first and second magnetoresistive effect elements, which are obtained by causing a sense current to pass through the first and second magnetoresistive effect elements via the first line, is detected to be read as any one of binary information.

BRIEF DESCRIPTION OF THE DRAWINGS

In the drawings:

FIGS. 5A and 5B are graphs showing the results of reliability tests in the data retention of magnetoresistive effect elements in the first embodiment and comparative examples 1 and 2;

EMBODIMENTS

Figure 1:
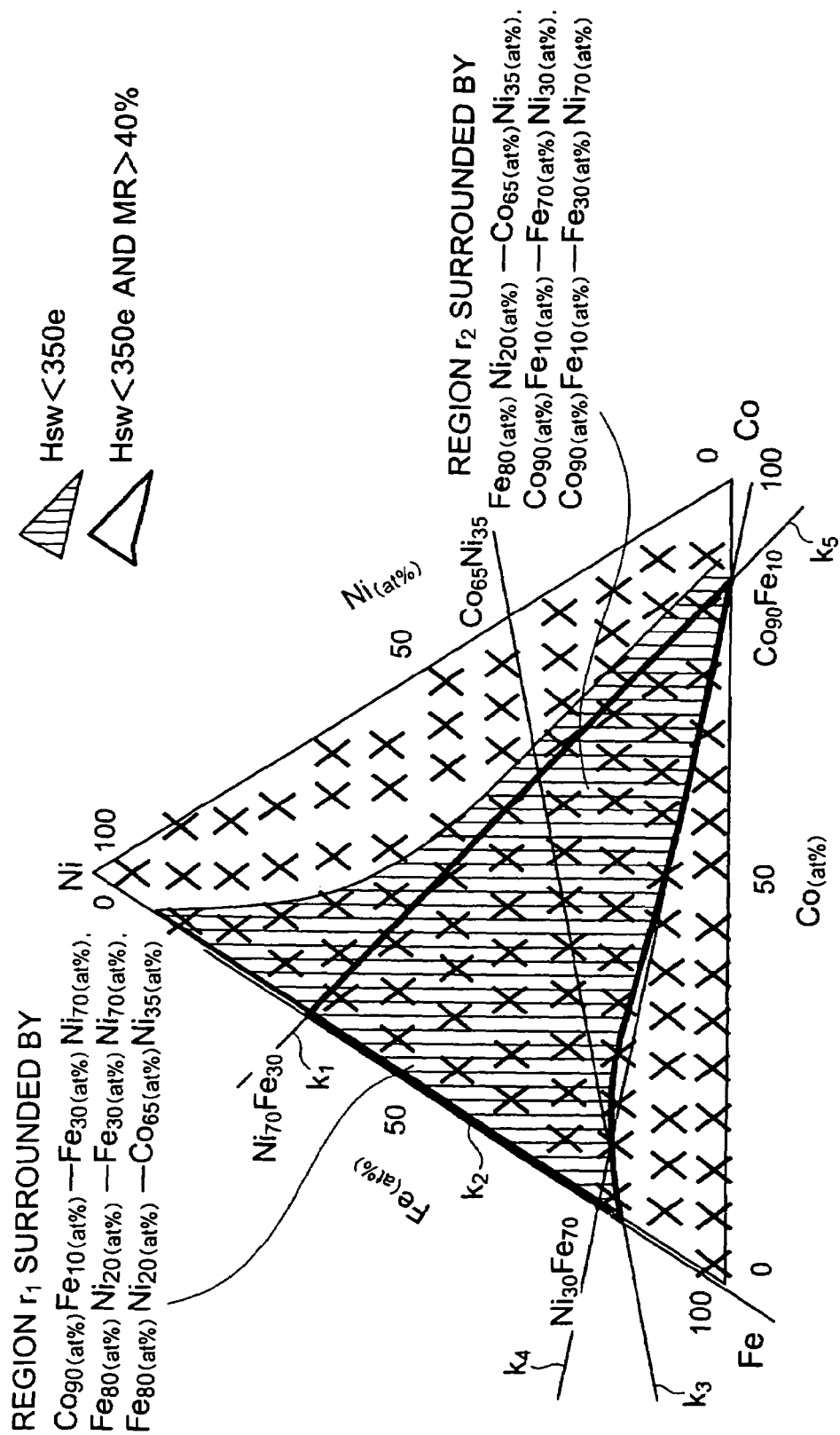
FIG. 1 is a Co—Fe—Ni ternary phase diagram showing MR characteristics and switching magnetic field characteristics when Co—Fe—Ni is used as the composition of a storage layer of the first embodiment of a magnetoresistive effect element according to the present invention.

Before describing the embodiments of the present invention, the circumstances that the present invention has been made will be described below.

At present, it is known that, when a TMR element is used as a storage element for an MRAM, the switching magnetic field increases in proportion to the inverse number of the length of a short side under the influence of a demagnetizing field due to magnetic poles produced on both sides of the TMR element. Moreover, it is the most stable that the internal magnetization of a ferromagnetic substance is parallel to a magnetic easy direction in the vicinity of the central portion thereof due to the effects of magnetic anisotropy and exchange interaction. However, since a magnetic pole is produced on both sides to increase magnetostatic energy, a magnetic domain (edge domain) having a magnetization direction different from that in the central portion is formed so as to decrease magnetostatic energy even at the sacrifice of the increase of energy due to the production of the magnetic pole. This edge domain makes a magnetization inversion process complicated, and decreases residual magnetization in a non-magnetic field state, i.e. the rate of change in magnetic resistance to be an output.

Therefore, in order to realize a highly integrated MRAM, it is important to select a material, which essentially has a small coercive force and which has a large MR ratio capable of obtaining a sufficient output in a non-magnetic field state, as a ferromagnetic substance used for a storage layer of a TMR element of an MRAM.

In the present MRAMs, an example of the use of Ni—Fe as the magnetic material of a storage layer has been proposed (see IEEE International Solid-State Circuits Conference, Digest of Technical Papers, 2000, p. 128, IEEE International Solid-State Circuits Conference, Digest of Technical Papers, 2000, p. 120).

Comparing both of Ni—Fe and Co—Fe with each other in view of the above described conditions that "the coercive force is small" and "the MR ratio (the rate of change in MR) is large", Co—Fe has a large coercive force although the rate of change in MR is a very large rate of 40% or more. On the other hand, Ni—Fe has a very small coercive force in a composition range in which the composition of Ni is large (about 80 at % or more). However, the rate of change in MR is smaller than that of Co—Fe.

Although the magnitude of the coercive force, i.e. the magnitude of the switching magnetic field, depends on the kinds of the magnetic material and the composition of the alloy, the coercive force is generally large in a Co—Fe alloy having a composition wherein the rate of change in MR is large. On the other hand, the rate of change in MR is large as an alloy composition material having a large spin polarizability is used. On the other hand, it is known that the magnitude of the coercive force is not only very sensitive to the kind of the magnetic material and the composition of the alloy, but it is also very sensitive to the material of a laminated structure underlying a magnetic layer and to the magnitude of roughness due to the lamination. If roughness is large, a magnetic connection is produced between magnetic layers, so that the coercive force increases. Therefore, it is also important to select a laminated structure and underlying material having small roughness, in addition to the use of a material essentially having a small coercive force as the material of the storage layer.

In particular, when a multi-layer laminated structure comprising ferromagnetic layers and non-magnetic layers is used as the structure of a storage layer, if roughness is large on the interface between a storage layer and a tunnel barrier layer or on the interface between a magnetization fixed layer and a tunnel barrier layer, there is a problem in that the magnitude of a switching magnetic field is extremely large. However, when a storage layer having a multi-layer laminated structure is used, if roughness is decreased, there is an advantage in that it is possible to decrease the switching magnetic field while maintaining a larger MR ratio than that when a single layer film is used.

In addition, if an interlayer coupling is produced between ferromagnetic layers of a storage layer having a multi-layer laminated structure, it is possible to obtain superior thermostability even if the size of a cell is decreased to decrease the volume of the storage layer. In this case, it is required to totally design a film structure capable of decreasing roughness.

As described above, magnetic materials used for storage layers at present do not simultaneously satisfy the three conditions that "the coercive force is small", "the rate of change is large", and "thermostability is excellent".

Therefore, the inventors was considered that a TMR element having low power consumption and high output, and a magnetic memory using the TMR element can be obtained by using the magnetic material and structure simultaneously satisfying these three conditions as those of a storage layer and by selecting a laminated structure and underlying material having small roughness.

Referring to the accompanying drawings, the basic concept and embodiments of the present invention will be described below.

In general, a so-called magnetically soft material, wherein a magnetization direction rapidly follows an external magnetic field to easily vary, is used as the material of a storage layer of a TMR element. Main features of a magnetically soft material are that (a) magnetic permeabilities, such as initial magnetic permeability and maximum magnetic permeability, are large, (b) residual magnetization and saturated magnetization are large, and (c) coercive force is small. If the magnetic anisotropy of a magnetic material is caused by magnetostriction, the initial magnetic permeability is in proportion to the inverse number of a magnetostriction constant, and the coercive force is in proportion to the magnetostriction force, so that a magnetic material having a smaller magnetostriction force is suitable for a TMR element. Moreover, in addition to these conditions, a magnetic material used as the material of a storage layer of a TMR element is required to having a large rate of change in magnetic resistance in order to obtain a high output. This can be realized by using a material having a large spin polarizability, a material having a high magnetic transition temperature (curie temperature) arranged via a tunnel barrier layer, or a material having a large composition of Fe.

Figure 2A:
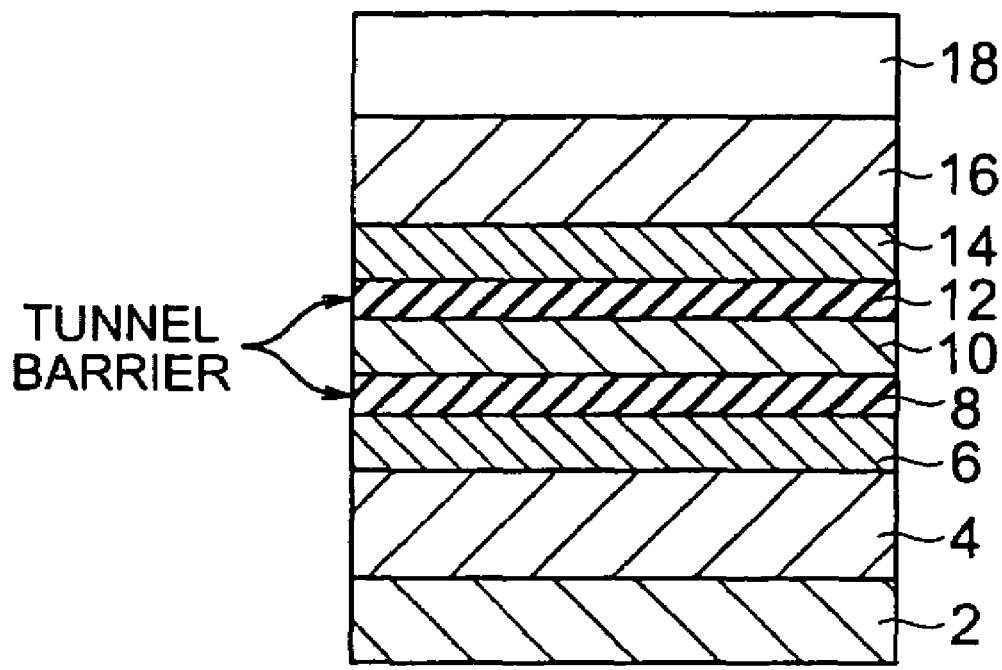
FIGS. 2A and 2B are sectional views showing the construction of the magnetoresistive effect element in the first embodiment.
Figure 2B:
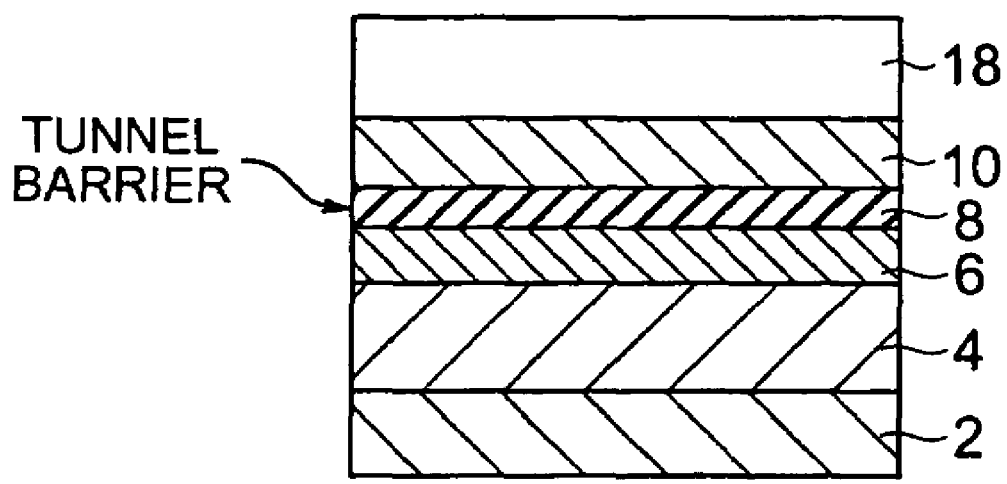

TMR elements include a ferromagnetic multiple tunnel junction (double junction in the figure) having a plurality of tunnel barrier layers as shown in FIG. 2A, and a ferromagnetic single tunnel junction having only one tunnel barrier layer as shown in FIG. 2B. That is, the ferromagnetic single tunnel junction has a construction wherein an antiferromagnetic layer 4, a magnetization fixed layer 6 (also called pinned layer), a tunnel barrier layer 8, a magnetization free layer 10 (also called storage layer) and a cover/hard mask layer 18 are sequentially provided on an underlying metal layer 2. The ferromagnetic double tunnel junction has a construction wherein an antiferromagnetic layer 4, a magnetization fixed layer 6, a tunnel barrier layer 8, a storage layer 10, a tunnel barrier layer 12, a magnetization fixed layer 14, an antiferromagnetic layer 16 and a cover/hard mask layer 18 are sequentially provided on an underlying metal layer 2.

First Embodiment

In order to find the construction of such a storage layer that the MR ratio of a TMR element is larger and the switching magnetic field is smaller, the following experiments were carried out.

First, the TMR element in this embodiment is a ferromagnetic double tunnel junction type TMR element having a size of 0.15×0.2 μm². The storage layer was formed of a ternary alloy of Co—Fe—Ni having a three-layer structure wherein a non-magnetic layer of Ru was sandwiched between ferromagnetic layers. The thickness of the ferromagnetic layer forming this storage layer was 2 μm. In order to obtain a large MR ratio as a magnetization fixed layer, a Co—Fe alloy, particularly $Co_{50}Fe_{50}$ alloy was used. The underlying metal layer has a two-layer structure of Ta/Ru. Therefore, the construction of the TMR element in this embodiment is Ta/Ru/IrMn/CoFe/Ru/CoFe/AlOx/CoFeNi/Ru/CoFeNi/AlOx/CoFe/Ru/CoFe/IrMn/Ru/upper wiring.

First, a TMR element is prepared when the composition of the ternary alloy of Co—Fe—Ni forming the ferromagnetic layer of the storage layer is changed, and the results of examination of the MR ratio and switching magnetic field are shown in FIG. 1. The composition of the ferromagnetic layer forming the storage layer is shown by the symbol x in FIG. 1. A region shown by thin vertical lines in FIG. 1 is a region wherein the switching magnetic field is 35 Oe or less when the above described TMR element is prepared. A region below the line $Co_{90(at\ \%)}Fe_{10(at\ \%)}$—$Fe_{30(at\ \%)}Ni_{70(at\ \%)}$ in FIG. 1 is a region wherein the MR ratio is 40% or more at a room temperature.

From the results of this experiment, it was found that the ferromagnetic layer of the storage layer of the TMR element is preferably formed of an Ni—Fe—Co ternary alloy which has a composition selected from a composition region $r_1$ surrounded by a straight line $k_1$ of $Co_{90(at\ \%)}Fe_{10(at\ \%)}$—$Fe_{30(at\ \%)}Ni_{70(at\ \%)}$, a straight line $k_2$ of $Fe_{80(at\ \%)}Ni_{20(at\ \%)}$—$Fe_{30(at\ \%)}Ni_{70(at\ \%)}$ and a straight line $k_3$ of $Fe_{80(at\ \%)}Ni_{20(at\ \%)}$—$Co_{65(at\ \%)}Ni_{35(at\ \%)}$, and a composition region $r_2$ surrounded by a straight line $k_3$ of $Fe_{80(at\ \%)}Ni_{20(at\ \%)}$—$Co_{65(at\ \%)}Ni_{35(at\ \%)}$, a straight line $k_4$ of $Co_{90(at\ \%)}Fe_{10(at\ \%)}$—$Fe_{70(at\ \%)}Ni_{30(at\ \%)}$ and a straight line $k_5$ of $Co_{90(at\ \%)}Fe_{10(at\ \%)}$—$Fe_{30(at\ \%)}Ni_{70(at\ \%)}$.

Furthermore, the magnetization fixed layer is preferably formed of Co—Fe since an MR ratio of 40% or more can be obtained. In this embodiment, the magnetization fixed layer was formed of $Co_{50}Fe_{50}$, the tendency of MR characteristics was not greatly influenced by using $Co_{10}Fe_{90}$—$Co_{90}Fe_{10}$.

In order to examine the influence of the roughness of the interface between the storage layer and the tunnel barrier layer or between the magnetization fixed layer and the tunnel barrier on the switching magnetic field, TMR elements were prepared so that the thickness of the antiferromagnetic layer 4 near the underlying metal layer 2 of the TMR element was changed from 8 nm to 14 nm at intervals of 2 nm. Furthermore, the thickness of the antiferromagnetic layer 16 far from the underlying metal layer 2 was 8 nm. Therefore, the construction of the TMR element used for examining the influence of roughness is as follows.

Ta/Ru/IrMn(xnm)/CoFe/Ru/CoFe/AlOx/CoFeNi/Ru/CoFeNi/AlOx/CoFe/Ru/CoFe/IrMr(8 nm)/Ru/upper wiring TMR elements having the under-mentioned constructions were prepared as comparative examples 1 and 2. Samples wherein the thickness of the antiferromagnetic layer 16 far from the underlying metal layer 2 was 8 nm and thickness of the antiferromagnetic layer 4 near the underlying metal layer 2 was changed from 8 nm to 14 nm at intervals of 2 nm were prepared, and the influence of roughness was examined.

COMPARATIVE EXAMPLE 1

Ta/Al/Ru/IrMn(xnm)/CoFe/Ru/CoFe/AlOx/CoFeNi/Ru/CoFeNi/AlOx/CoFe/Ru/CoFe/IrMr(8 nm)/Ru/upper wiring

COMPARATIVE EXAMPLE 2

Ta/Ru/IrMn(xnm)/CoFe/Ru/CoFe/AlOx/CoFeNi/AlOx/CoFeNi/AlOx/CoFe/Ru/CoFe/IrMr(8 nm)/Ru/upper wiring That is, in Comparative Example 1, the construction of the underlying metal layer 2 of the TMR element is changed from Ta/Ru to Ta/Al/Ru. In Comparison Example 2, the storage layer of the TMR element has a simple layer structure unlike this embodiment wherein the storage layer of the TMR element has a three-layer structure, and the construction of the underlying metal layer 2 of the TMR element is formed of Ta/Ru which is the same as that in this embodiment.

When the thickness of the antiferromagnetic layer of InMn was changed, the cross section was observed by a transparent electron microscope (which will be also hereinafter referred to as TEM). As a result, it was found that the roughness (maximum surface roughness) of the interface between the storage layer or magnetization fixed layer and the tunnel barrier layer greatly depends on the underlying metal layer. Since the construction of the underlying metal layer 2 in this embodiment was the same as that in Comparative Example 2, roughness was substantially the same if the thickness of the antiferromagnetic layer was the same. However, since the underlying metal layer was formed of Ta/Al/Ru unlike this embodiment, it was observed that roughness was larger than that of the TMR element in this embodiment wherein the underlying metal layer of Ta/Ru was provided.

Figure 3:
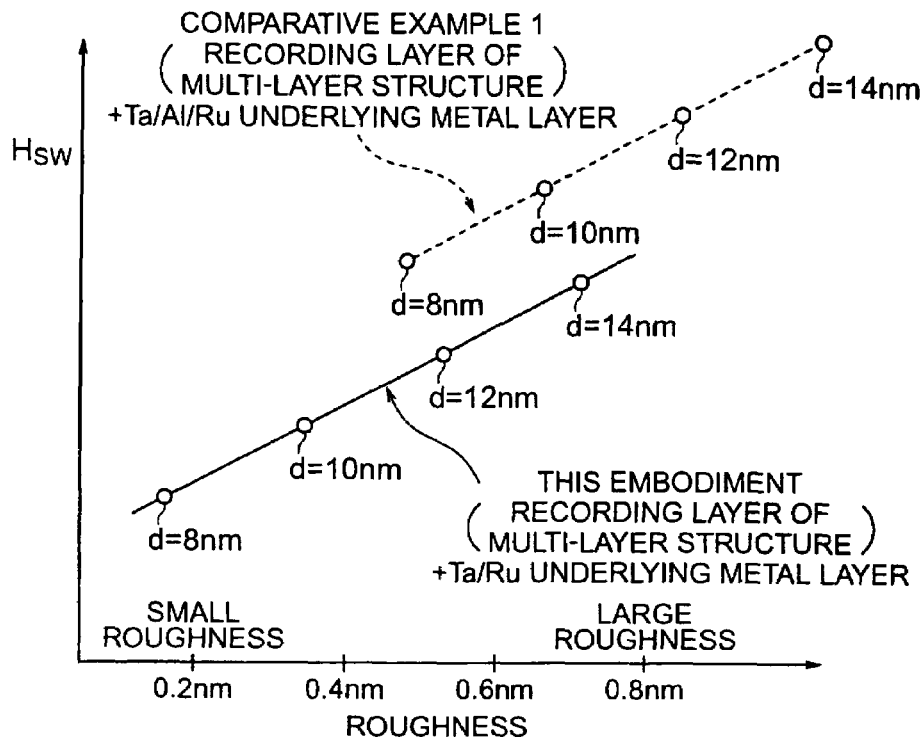
FIG. 3 is a graph showing characteristics with respect to roughness (maximum surface roughness) of the interface between a storage layer or a magnetization fixed layer and a tunnel barrier layer in switching magnetic fields in the first embodiment and comparative example 1.
Figure 4:
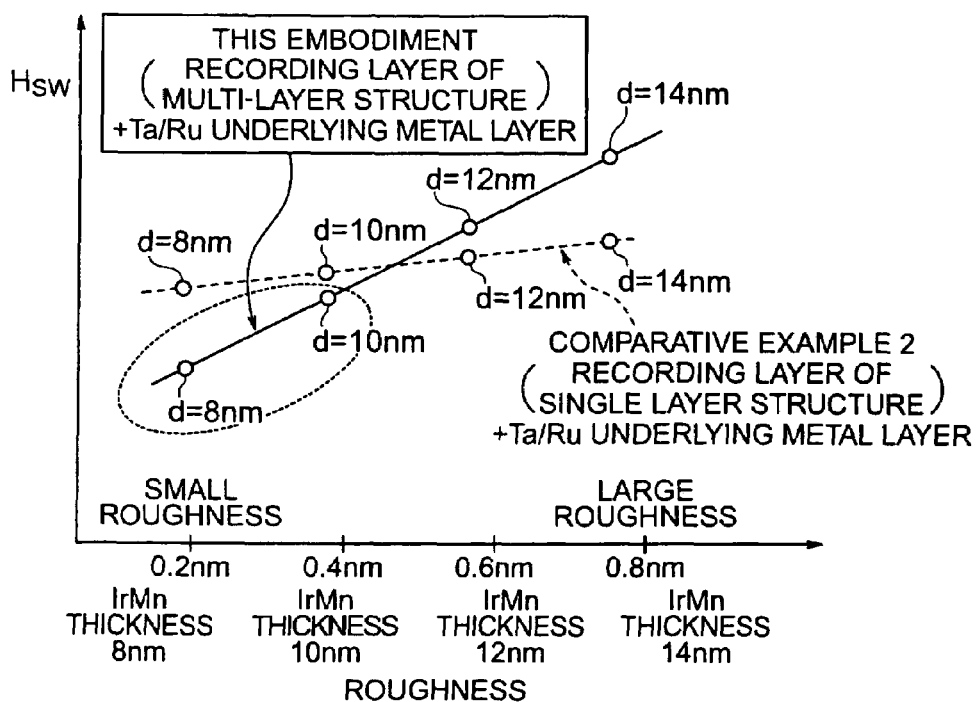
FIG. 4 is a graph showing characteristics with respect to roughness (maximum surface roughness) of the interface between a storage layer or a magnetization fixed layer and a tunnel barrier layer in switching magnetic fields in the first embodiment and comparative example 2.

FIG. 3 shows the dependency of the switching magnetic field $H_{sw}$ on roughness (maximum surface roughness) of the interface between the storage layer or magnetization fixed layer and the tunnel barrier layer of the TMR element in each of this embodiment and Comparative Example 1, and FIG. 4 shows the dependency of the switching magnetic field $H_{sw}$ on roughness of the interface between the storage layer or magnetization fixed layer and the tunnel barrier layer of the TMR element in each of this embodiment and Comparative Example 1. Furthermore, in FIGS. 3 and 4, d denotes the thickness of the antiferromagnetic layer near the underlying metal layer. As can be seen from FIG. 3, even if the storage layer has the same multi-layer structure and the thickness of the antiferromagnetic layer near the underlying metal layer in this embodiment and Comparative Example 1, roughness of the interface between the storage layer or magnetization fixed layer and the tunnel barrier layer of the TMR element in Comparative Example 1, wherein the underlying metal layer is formed of Ta/Al/Ru, is larger, and the switching magnetic field $H_{sw}$ thereof is also larger. In addition, as can be seen from FIG. 4, if roughness of the interface between the storage layer or magnetization fixed layer and the tunnel barrier layer is decreased, the switching magnetic field obtained in this embodiment wherein the storage layer has the three-layer structure is smaller than that in Comparative Example 2 wherein the storage layer has the single layer structure. Therefore, in a case where the storage layer has the multi-layer structure, if roughness of the interface between the storage layer or magnetization fixed layer and the tunnel barrier layer is 0.4 nm, the switching magnetic field can be smaller than that in a case where the storage layer has the single layer structure.

The reliability test in data retention (data output retention time) of each of the TMR elements in this embodiment and Comparative Example 1 and 2 when it was left in an oven was carried out. The results thereof are shown in FIGS. 5A and 5B. With respect to the TMR element in Comparative Example 2 wherein the storage layer has the single layer structure, data were held when the direction of spin of the ferromagnetic layer of the magnetization fixed layer near the storage layer and tunnel barrier layer was antiparallel (see FIG. 5B, whereas bits, in which data were not held, were observed when it was parallel (see FIG. 5A). However, both of the TMR elements in the embodiment and Comparative Example 1 had preferred reliability (see FIGS. 5A and 5B), so that it was found that it was possible to obtain a reliable element if the storage layer had the three-layer structure.

As described above, according to the TMR element in this embodiment, it is possible to obtain characteristics wherein the rate of change in MR is large and thermostability is excellent while the switching magnetic field is held to be small.

Figure 6A:
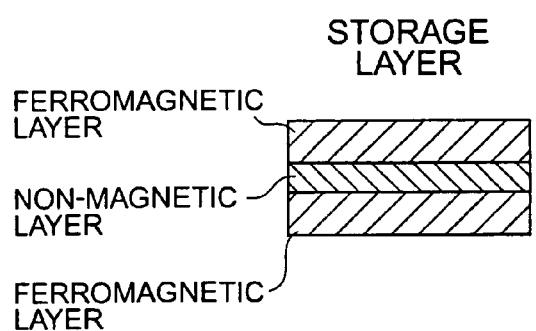
FIGS. 6A and 6B are sectional views showing the construction of a storage layer of the magnetoresistive effect element in the first embodiment.
Figure 6B:
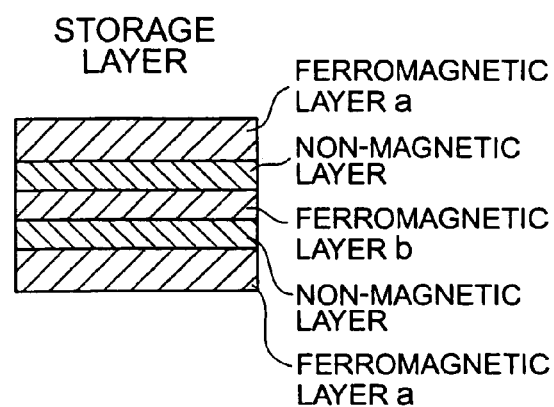

While the storage layer in this embodiment has the three-layer structure having the non-magnetic layer sandwiched between ferromagnetic layers as shown in FIG. 6A, the storage layer may have a structure comprising ferromagnetic layer a/non-magnetic layer/ferromagnetic layer b/non-magnetic layer/ferromagnetic layer a as shown in FIG. 6B. That is, the storage layer may have a structure wherein ferromagnetic layers are interlayer-coupled to each other via a non-magnetic layer. The bonding strength thereof may be ferromagnetic or antiferromagnetic if it is Hex=3 kOe or less. In the construction shown in FIG. 6B, the ferromagnetic layer b is thinner than the ferromagnetic layer 2, but it serves to decrease a potential barrier due to a so-called antimagnetic field of the ferromagnetic layer a, which has a structure wherein it is separated by the non-magnetic layers. If the storage layer of the TMR element has the structure shown in FIG. 6B, it is possible to obtain a smaller switching magnetic field more than that in the structure shown in FIG. 6A. For example, it was revealed that if a storage layer having a five-layer laminated structure comprising Co—Fe—Ni/Ru/Ni—Fe/Ru/Co—Fe—Ni, wherein the ferromagnetic layer a is formed of Co—Fe—Ni, the ferromagnetic layer b is formed of Ni—Fe and the non-magnetic layer is formed of Ru, is substituted for the storage layer having the three-layer laminated structure in this embodiment, the switching magnetic field can be further reduced by 10% to 20%.

While the thickness of the ferromagnetic layer of the recording layer was 2 nm in this embodiment, it is preferably in the range of from 1 nm to 3 nm. If it is less than 1 nm, the ferromagnetic layer is superparamagnetic, so that the thermostability of ferromagnetic spin can not be maintained. If the thickness is greater than 3 nm, the switching magnetic field is too large, so that the absolute value of the current pulse for switching increases to cause EM (Electro-migration) problems.

While the Co—Fe binary alloy ferromagnetic layer has been used as the magnetization fixed layer in this embodiment, if the Co—Fe binary alloy ferromagnetic layer is used as the magnetization fixed layer, the MR ratio can be larger than that if Co—Fe—Ni, Ni—Fe or Co—Ni is used.

Figures 7A, 7B, 7C:
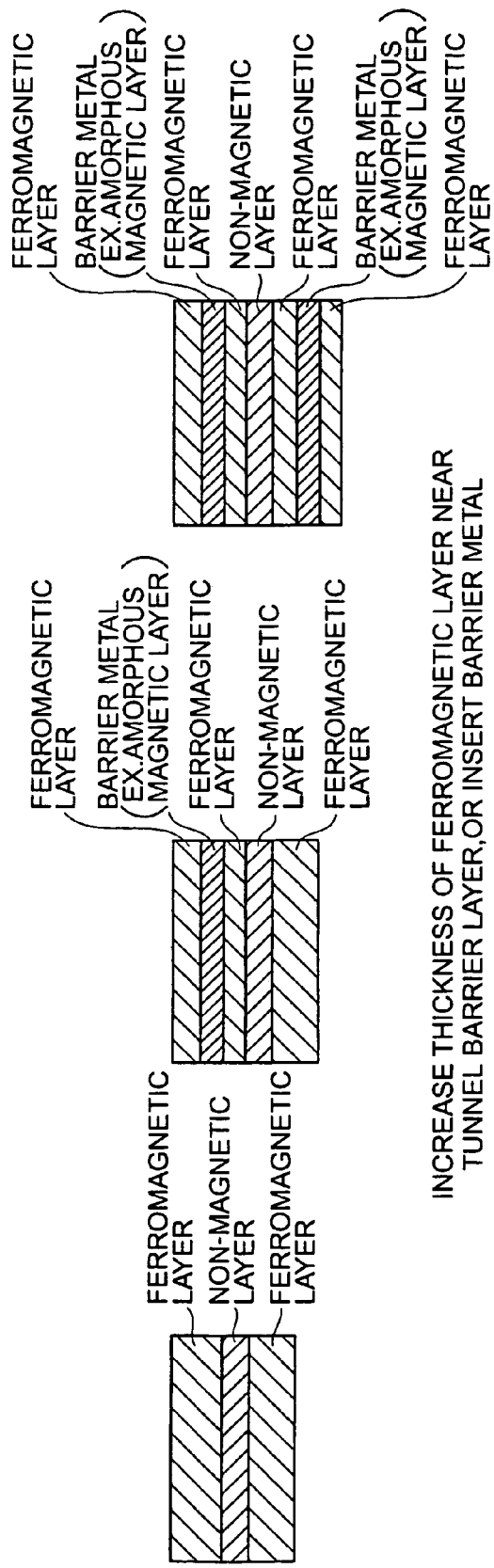
FIGS. 7A through 7C are sectional views showing the construction of a magnetization fixed layer of the magnetoresistive effect element in the first embodiment.

In the TMR element in this embodiment, as shown FIG. 7A, the magnetization fixed layer preferably has a three-layer structure of ferromagnetic layer/non-magnetic layer/ferromagnetic layer, and a thicker ferromagnetic layer near the tunnel barrier layer. In this structure, the stray field from the magnetization fixed layer can be canceled, so that the hysteresis curve of the MR curve can be adjusted so as to be symmetrical with respect to the zero magnetic field while holding thermostability.

The stray field $H_{stray}$ is in inverse proportion to the length L of the long side of the TMR element ($H_{stray}$=C/L) wherein C is a constant. Therefore, the increase of the thickness of the ferromagnetic layer near the tunnel barrier layer can be univocally determined in accordance with the length of the long side of the TMR element.

In the TMR element in this embodiment, the ferromagnetic layer of the magnetization fixed layer adjacent to at least the tunnel barrier layer preferably has a three-layer structure of ferromagnetic layer/amorphous magnetic layer/ferromagnetic layer. For example, as shown in FIG. 7B, the magnetization fixed layer has a laminated structure of ferromagnetic layer/amorphous magnetic layer/ferromagnetic layer/non-magnetic layer/ferromagnetic layer. Alternatively, as shown in FIG. 7C, the magnetization fixed layer has a laminated structure of ferromagnetic layer/amorphous magnetic layer/ferromagnetic layer/non-magnetic layer/amorphous magnetic layer/ferromagnetic layer. Furthermore, the amorphous magnetic layer is preferably an amorphous ferromagnetic layer. If the above described structure is used, even if the antiferromagnetic layer is formed of Pt—Mn, Ir—Mn, Ni—Mn or the like, the diffusion of Mn can be suppressed to maintain stability for a long time to provide a reliable TMR element.

Furthermore, the amorphous magnetic layer can be easily prepared by mixing a few percents to tens percents of Zr, Nb, Bi, Ta, W or the like with any one of Co, Fe, Ne and their alloys.

The non-magnetic layer used for the storage layer or magnetization fixed layer having the three-layer or multi-layer structure is preferably formed of any one of Ru (ruthenium), Ir (iridium), Os (osmium) and their alloys.

In the TMR element in this embodiment, the antiferromagnetic layer provided so as to contact the magnetization fixed layer is preferably formed of any one of $Pt_xMn_{1-x}$, $Ni_yMn_{1-y}$ and $Ir_zMn_{1-z}$ wherein 49.5 at %≦x, y≦50.5 at % and 22 at %≦z≦27 at %, and the thickness of the antiferromagnetic layer is preferably 10 nm or less, more preferably 9 nm or less. Thus, when roughness of the interface between the magnetization fixed layer and the tunnel barrier layer or the interface between the tunnel barrier layer and the storage layer is observed by the TEM, the peak-to-peak value, i.e. the maximum surface roughness can be 0.4 nm or less, preferably 0.3 nm or less.

As a method for suppressing roughness, if the material of the electrode of the underlying metal layer provided below the antiferromagnetic layer is formed of Ta or W and if the buffer layer is formed of Ru, Ir or Pt, roughness (maximum surface roughness) of the surface contacting the magnetization fixed layer can be in the range of from 0.2 nm to 0.4 nm.

The tunnel barrier layer of the TMR element may be formed of any one of various insulating materials (dielectric substances), such as $Al_2O_3$(aluminum oxide), $SiO_2$(silicon oxide), MgO (magnesium oxide), AlN (aluminum nitride), $Bi_2O_3$(bismuth oxide), $MgF_2$(magnesium fluoride), $CaF_2$ (calcium fluoride), $SrTiO_2$(strontium titanium oxide), $AlLaO_3$(aluminum lanthanum oxide), Al—N—O (aluminum oxynitride) and GaO (gallium oxide).

These compounds are not required to have completely accurate stoichiometric compositions. Excess and deficiency of oxygen, nitrogen or fluorine may exist in these compounds. This insulating layer (dielectric layer) is preferably thin to such an extend that a tunnel current flows. In fact, the thickness of the insulating layer is preferably 10 nm or less.

Such a TMR element can be formed on a predetermined substrate by a usual thin-film forming means, such as various sputtering methods, deposition method and molecular beam epitaxial method. In this case, the substrate may be any one of various substrates of, e.g. Si (silicon), $SiO_2$ (silicon oxide), $Al_2O_3$(aluminum oxide), spinel and AlN (aluminum nitride).

Figure 8A:
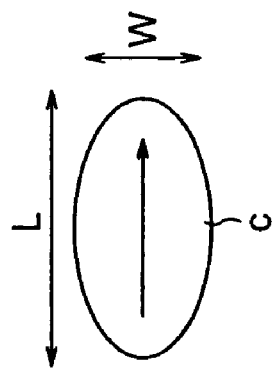
FIGS. 8A through 8E are illustrations showing the shape of the magnetoresistive effect element in the first embodiment.
Figure 8D:
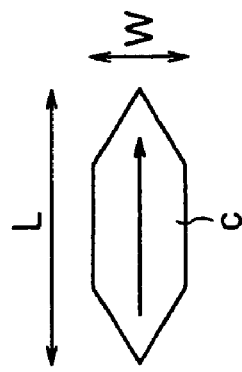
Figure 8B:
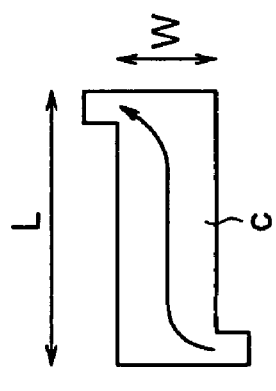
Figure 8E:
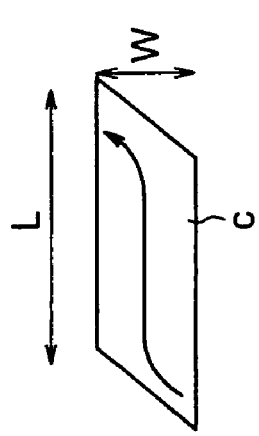
Figure 8C:
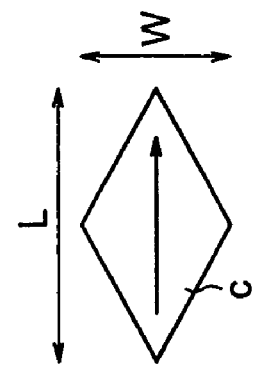

With respect to the shape of the TMR element, the magnetization directions M1 and M2 must not always be linear. With respect to the shape of the TMR element, edge domains shown in FIGS. 8A through 8E may be formed. FIGS. 8A through 8E are schematic diagrams showing other examples of plane shapes of the storage layer of the TMR element in this embodiment. That is, the shape of the storage layer of the TMR element may be any one of various shapes, such as a rectangular having protruding portions on both ends of one diagonal as shown in FIG. 8A, a parallelogram as shown in FIG. 8B, a rhombus as shown in FIG. 8C, an ellipse as shown in FIG. 8D, and an edge inclined shape as shown in FIG. 8E.

If the storage layer is patterned so as to have the shape shown in any one of FIGS. 8A through 8C and 8E, corner portions are often rounded in fact, and such rounded corner portions may be formed. These asymmetrical shapes can be easily prepared by causing the pattern shape of a reticule used in photolithography to be asymmetric.

Second Embodiment

Figure 9:
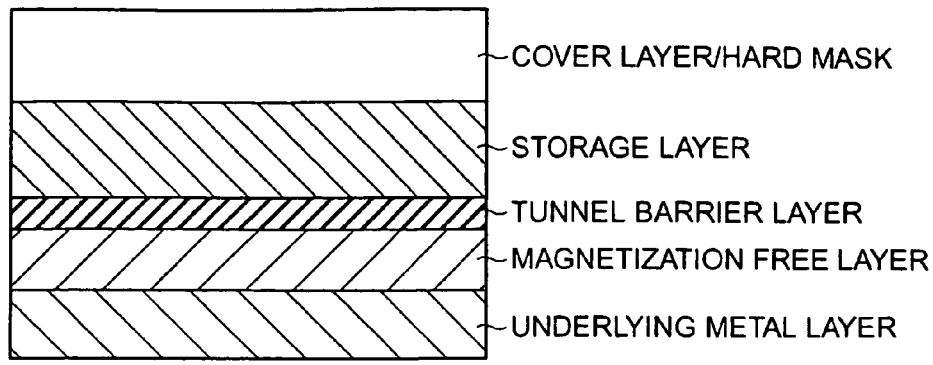
FIG. 9 is a sectional view showing the construction of the second embodiment of a magnetoresistive effect element according to the present invention.

FIG. 9 shows the construction of the second embodiment of a TMR element according to the present invention. The TMR element in this embodiment has a construction wherein a magnetization free layer, a tunnel barrier layer, a storage layer and a cover layer/hard mask are sequentially formed on an underlying metal layer. The TMR element may comprise underlying metal layer/storage layer/tunnel barrier layer/magnetization free layer/cover layer/hard mask. That is, in the TMR element in the first embodiment shown in FIG. 2B, the magnetization free layer is substituted for the antiferromagnetic layer and magnetization fixed layer (pinned layer).

In the TMR element in this embodiment, the storage layer has a construction wherein a plurality of ferromagnetic layers are stacked via non-magnetic layers similar to that in the first embodiment shown in FIGS. 6A, 6B. The roughness (maximum surface roughness) of the interface between the storage layer and the tunnel barrier layer is 0.4 nm or less. The magnetization free layer includes at least one ferromagnetic layer.

The underlying metal layer has the same construction as that in the first embodiment.

Similar to the first embodiment, the TMR element in this second embodiment can obtain characteristics wherein the rate of change in MR is large and thermostability is excellent while maintaining a small switching magnetic field.

Third Embodiment

Referring to the accompanying drawings, the third embodiment of a magnetic memory according to the present invention. In this third embodiment, the TMR element described in the first and second embodiments is used as a storage element of the magnetic memory.

Figures 10A, 10B:
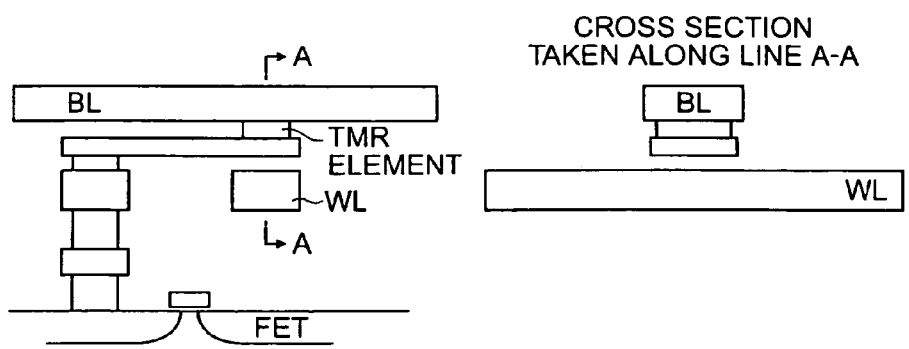
FIG. 10A is an illustration showing an example of a unit memory cell for use in the third embodiment of a magnetic memory according to the present invention.
FIG. 10B is a sectional view taken along line A-A of FIG. 10A.
Figures 11A, 11B:
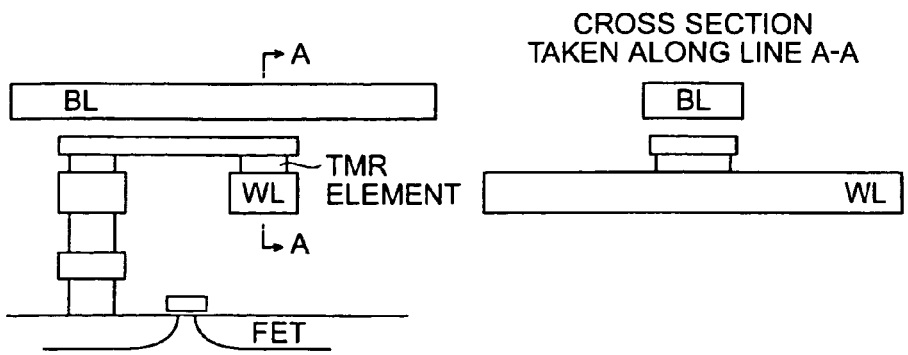
FIG. 11A is an illustration showing an example of a unit memory cell for use in the third embodiment of a magnetic memory according to the present invention.
FIG. 11B is a sectional view taken along line A-A of FIG. 11A.
Figures 12A, 12B:
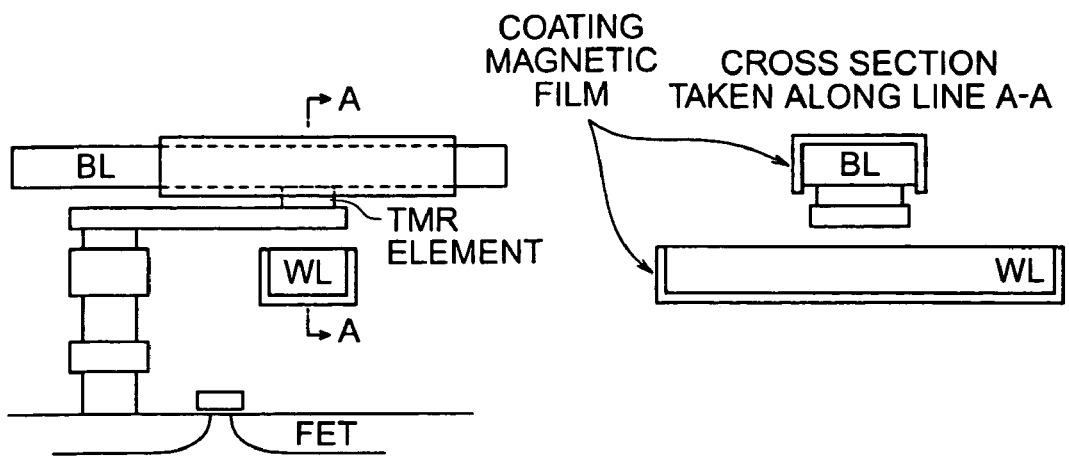
FIG. 12A is an illustration showing an example of a unit memory cell for use in the third embodiment of a magnetic memory according to the present invention.
FIG. 12B is a sectional view taken along line A-A of FIG. 12A.
Figures 13A, 13B:
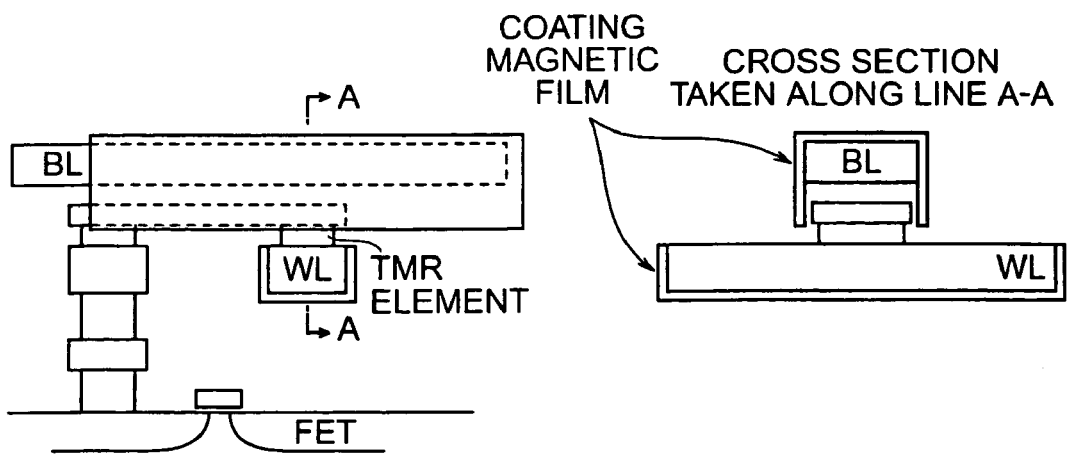
FIG. 13A is an illustration showing an example of a unit memory cell for use in the third embodiment of a magnetic memory according to the present invention.
FIG. 13B is a sectional view taken along line A-A of FIG. 13A.

FIGS. 10A through 13B are sectional views simply showing a unit cell of a magnetic memory in this embodiment when the TMR element is used as a storage element and a MOS transistor is used as a cell selecting element. FIG. 10A shows a unit cell wherein one end of the TMR element is connected to a bit line BL, the other end thereof being connected to one of a source and drain of a selecting transistor via an extraction electrode and a connecting plug, and a writing word line WL is provided below the TMR element. FIG. 10B is a sectional view taken along line A-A of FIG. 10A. FIG. 11A shows a unit-cell wherein one end of the TMR element is connected to a word line WL, the other end thereof being connected to one of a source and drain of a selecting transistor via an extraction electrode and a connecting plug, and a writing bit line BL is provided above the TMR element. FIG. 11B is a sectional view taken along line A-A of FIG. 11A. FIG. 12A shows a unit cell having a construction wherein the bit line BL and the word line WL are coated with a magnetic substance in the unit cell shown in FIG. 10A. FIG. 13A shows a unit cell having a construction wherein the bit line BL and the word line WL are coated with a magnetic substance in the unit cell shown in FIG. 11A. Furthermore, FIGS. 12B and 13B are sectional views taken along line A-A of FIGS. 12A and 13A, respectively.

In the magnetic memory having any one of the unit cells shown in FIGS. 10A through 13B, when reading is carried out, a current is caused to pass through a TMR element by the transistor, and "1" or "0" is determined by whether the resistance of the TMR element is large or small writing of information in the TMR element is carried out by a magnetic field which is produced by causing a current pulse to pass through the word line WL and bit line BL provided above and below the TMR element. For example, if a current is caused to pass through each of the bit line BL and word line WL, magnetic fields due to current are produced around them. By a magnetic field obtained by synthesizing these magnetic fields due to current, the magnetization of the storage layer of the TMR element can be inverted.

During this writing, in order to invert magnetization in a predetermined direction, a current pulse in a predetermined direction may be suitably caused to pass through both of the bit line BL and word line WL. Thus, the decrease of the current value per line and the selection of a cell can be carried out as compared with a case where magnetization inversion is caused by causing a current to pass through any one of the bit line BL and word line WL. As a result, it is possible to provide a magnetic memory wherein the fatigue of lines is small and reliability is high. As shown in FIGS.

12A through 13B, if the bit line BL and word line WL are coated with a magnetic substance, the magnetic field efficiency due to current can be increased by two (FIGS. 11A,11B) to five or more (FIGS. 12A,12B), so that power consumption can be decreased.

Figure 14:
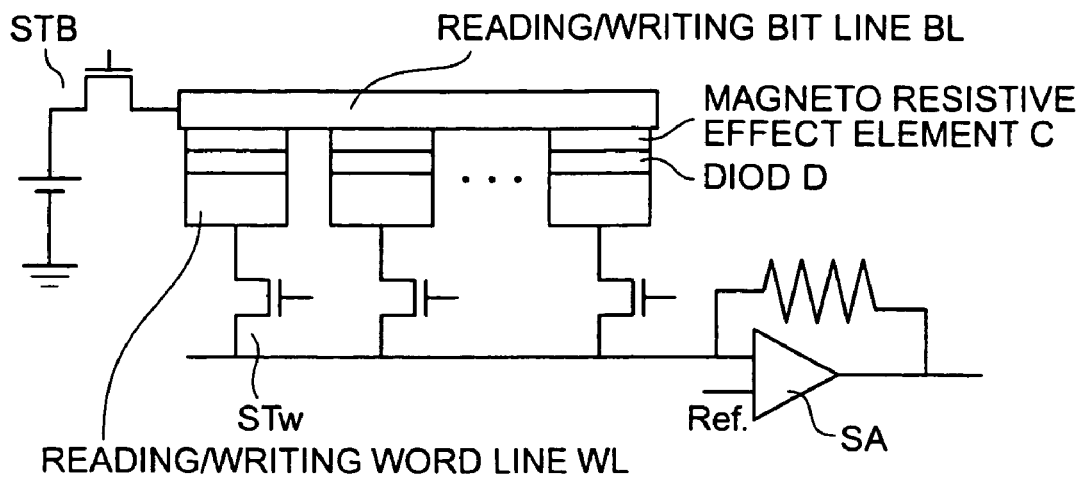
FIG. 14 is an illustration showing a first example of an architecture of the magnetic memory in the third embodiment.

FIG. 14 is a schematic diagram showing a first example of an architecture of the magnetic memory in this embodiment. That is, this figure shows a sectional structure of a memory array. In this architecture, a plurality of TMR elements C are connected to the reading/writing bit line BL in parallel. The reading/writing word line WL is connected to the other end of each of the TMR elements C via a diode D. Each word line WL is connected to a sense amplifier SA via a selecting transistor STw for selecting each word line WL. The reading/writing bit line BL is grounded via a selecting transistor STB for selecting the bit line BL.

In the first example of the magnetic memory shown in FIG. 14, when reading is carried out, the bit line BL and word line WL connected to a target TMR element are selected by the selecting transistors STB and STw, respectively, so that a current is detected by the sense amplifier SA. When writing is carried out, the bit line BL and word line WL connected to a target TMR element C are selected by the selecting transistors STB and STw, to cause a writing current to pass there through. At this time, writing can be carried out by directing the magnetization of the storage layer of the TMR element C to a predetermined direction by the writing magnetic field which is obtained by synthesizing magnetic fields caused by the bit line BL and word line WL, respectively.

The diode serves to disconnect a by-pass current which passes through the other TMR elements which are provided as a matrix.

Figure 15:
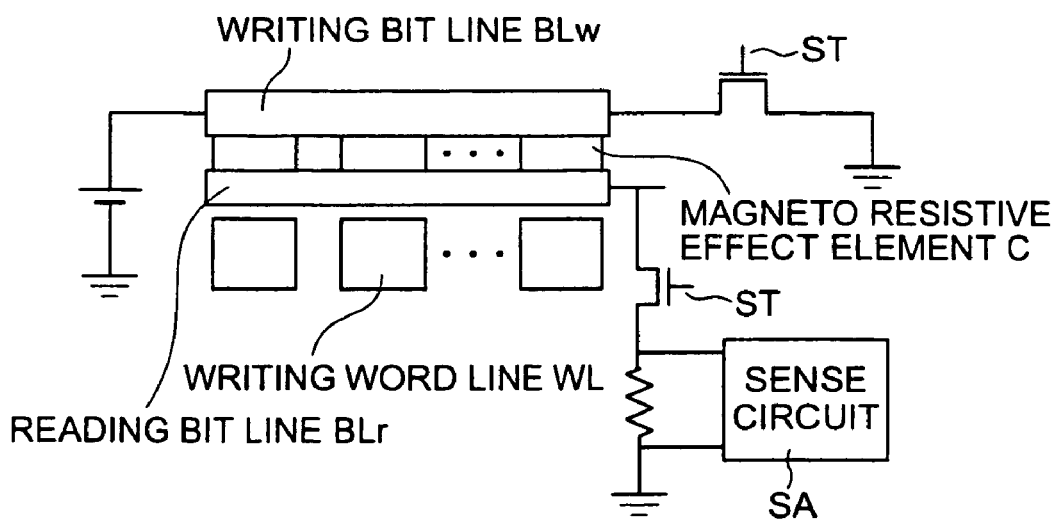
FIG. 15 is an illustration showing a second example of an architecture of the magnetic memory in the third embodiment.

Referring to FIG. 15, a second example of an architecture of the magnetic memory in this embodiment will be described below.

FIG. 15 shows a schematic diagram showing a second example of an architecture capable of integrating a memory array. That is, this figure shows a sectional structure of a memory array.

This architecture is a ladder type wherein a plurality of TMR elements C are provided in parallel between the reading/writing bit line BL and the reading bit line BLr. Moreover, the writing word line WL extends so as to cross the bit line BLw in the vicinity of each of the TMR elements.

Writing in the TMR element can be carried out by causing a synthetic magnetic field of a magnetic field, which is produced by causing a writing current to pass through the reading/writing bit line BLw, and a magnetic field, which is produced by causing a writing current to pass through the writing word line WL, to act on the storage layer of the TMR element.

On the other hand, when reading is carried out, a voltage applied between the bit lines BLw and BLr. Then, current passes through all of the TMR elements connected in parallel therebetween. While the total current is detected by the sense amplifier SA, a voltage is applied to a word line WL in the vicinity of a target TMR element to rewrite magnetization of the storage layer of the target TMR element in a predetermined direction. By detecting the variation in current at this time, the target TMR element can be read.

That is, if the magnetization direction of the storage layer before rewriting is the same as the magnetization direction after rewriting, the current detected by the sense amplifier SA does not vary. However, if the magnetization direction of the storage layer is inverted before and after rewriting, the current detected by the sense amplifier SA is changed by the magnetoresistive effect. Thus, the magnetization direction of the storage layer before rewriting, i.e. stored data, can be read. However, this method corresponds to a so-called "destructive read" for changing stored data when reading is carried out.

On the other hand, if the TMR element has the structure of magnetization free layer tunnel barrier layer/magnetic recording layer described in the second embodiment, a "non-destructive read" can be carried out. That is, if the TMR element having this structure is used, the magnetization direction is recorded in the storage layer, and when reading is carried out, the magnetization direction of the magnetization free layer is suitably changed to compare the sense current, so that the magnetization direction of the storage layer can be read. However, in this case, it is required to design so that the magnetization inverted magnetic field of the magnetization free layer is smaller than the magnetization inverted magnetic field of the storage layer.

Figure 16:
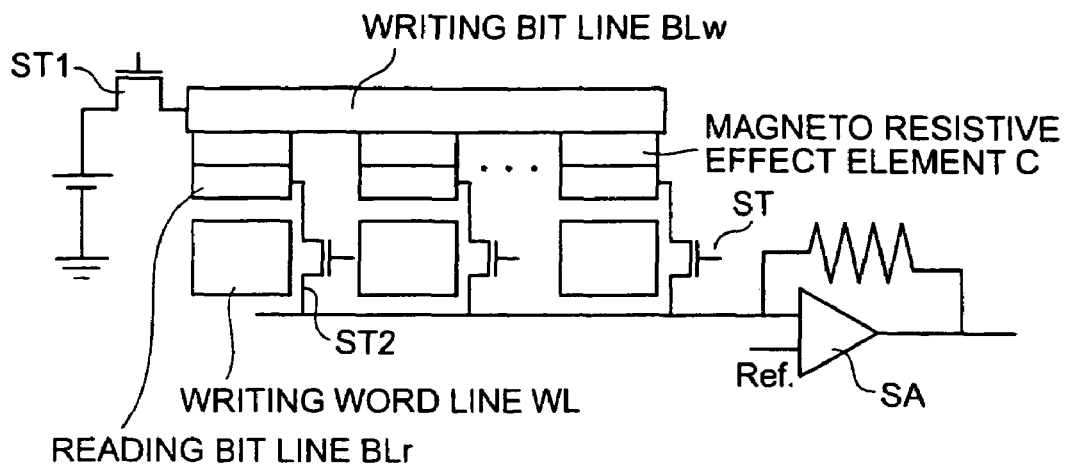
FIG. 16 is an illustration showing a third example of an architecture of the magnetic memory in the third embodiment.

FIG. 16 is a schematic diagram showing a third example of an architecture of a magnetic memory in this embodiment. That is, this figure shows a sectional structure of a memory array.

In this architecture, a plurality of TMR elements C are connected to a reading/writing bit line BLw in parallel, and the other ends of these TMR elements are connected to reading bit lines BLr as a matrix. In the vicinity of the reading bit lines BLr, a writing word line WL is arranged.

Writing in the TMR element C can be carried out by causing a synthetic magnetic field of a magnetic field, which is produced by causing a writing current to pass through the reading/writing bit line BLw, and a magnetic field, which is produced by causing a writing current to pass through the writing word line WL, to act on the storage layer of the TMR element.

On the other hand, when reading is carried out, the selecting transistor ST can select a writing bit line BLw and a reading bit line BLr to cause a sense current to pass through a target TMR element to be detected by the sense amplifier SA.

Figure 17:
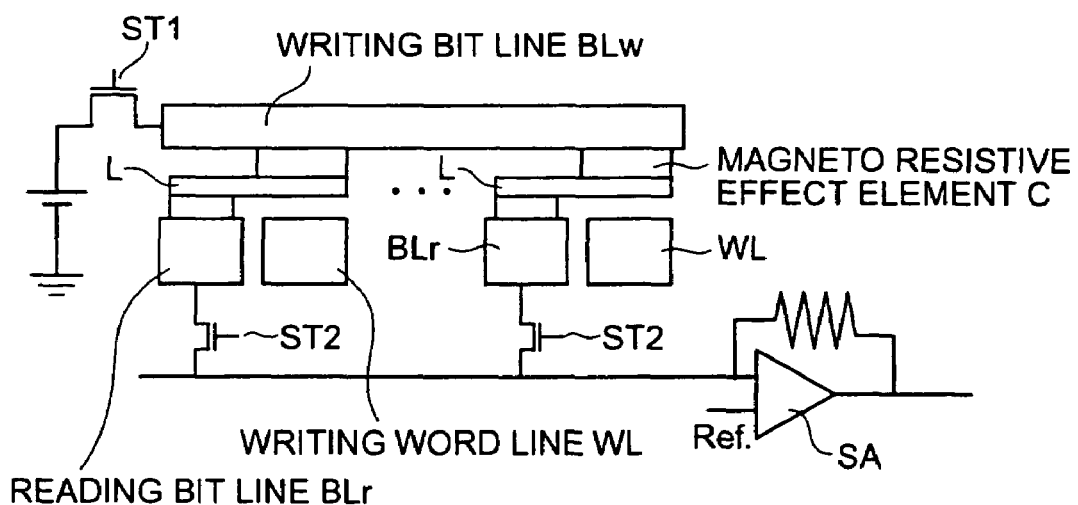
FIG. 17 is an illustration showing a fourth example of an architecture of the magnetic memory in the third embodiment.

Referring to FIG. 17, a fourth example of an architecture of the magnetic memory in this embodiment will be described below.

FIG. 17 shows a schematic diagram showing a fourth example of an architecture of the magnetic memory in this embodiment. That is, this figure shows a sectional structure of a memory array. The reading bit line BLr is connected to the TMR element C via a lead L, and the writing word line WL is arranged just below the TMR element C. These features are different from those in the above described examples. Thus, the TMR element C can be closer to the writing word line WL than that in the structure of FIG. 16. As a result, the writing magnetic field from the word line WL can more effectively act on the TMR element.

Differential amplification type and multi-valued type architectures will be described below.

Figures 18A, 18B:
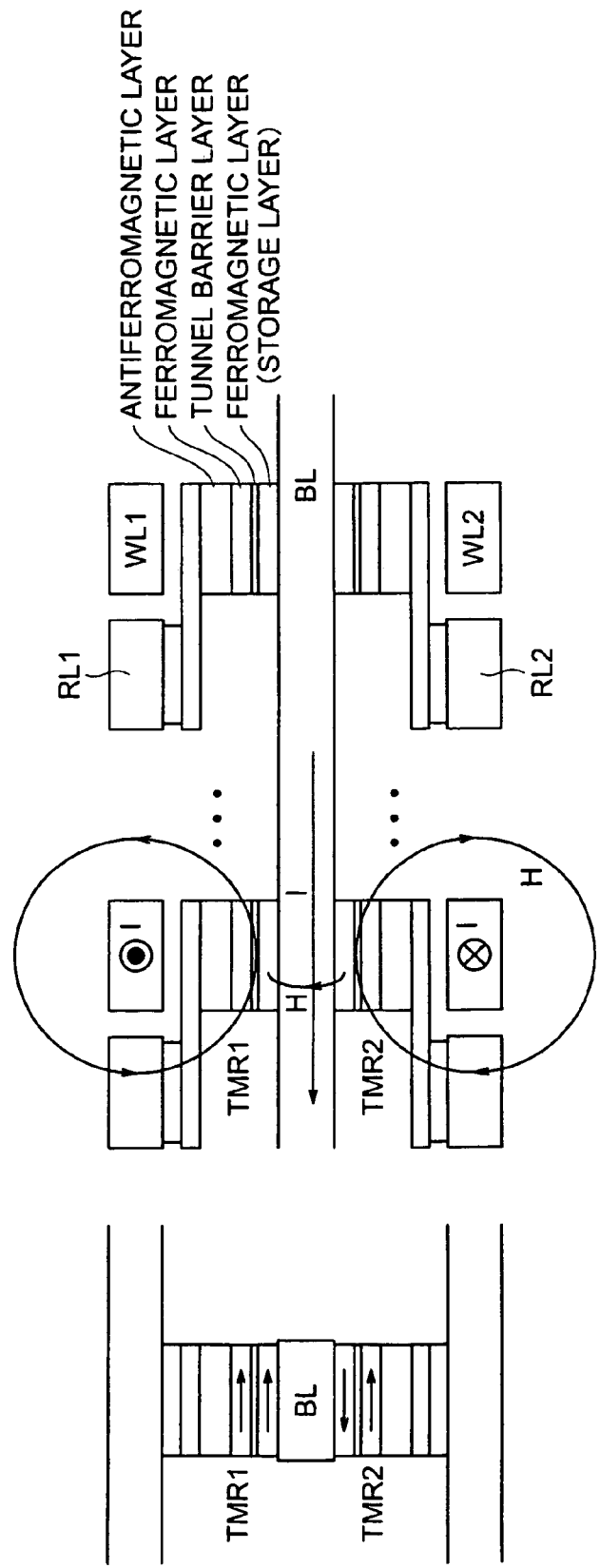
FIGS. 18A and 18B are front and side views of a fifth example of the magnetic memory in the third embodiment, respectively.
Figures 19A, 19B:
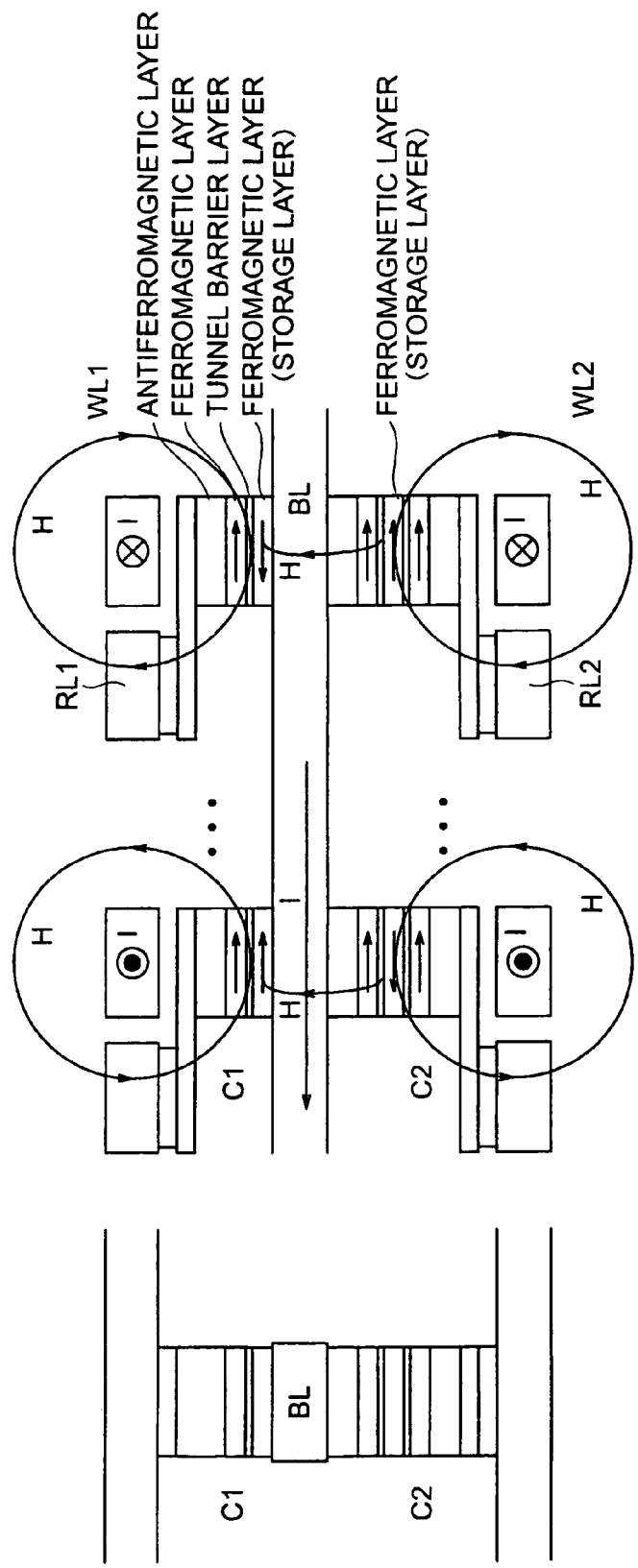
FIGS. 19A and 19B are front and side views of a sixth example of an architecture the magnetic memory in the third embodiment, respectively.

FIGS. 18A, 18B and FIGS. 19A and 19B show differential amplification type and multi-valued type architectures of a magnetic memory in this embodiment, respectively. FIGS. 18A and 18B are front and side views showing a differential amplification type architecture of a magnetic memory in this embodiment, respectively. FIGS. 19A and 19B are front and side views showing a multi-valued type architecture of a magnetic memory in this embodiment, respectively.

In the magnetic memories of the respective types, a bit line BL is arranged so as to cross word lines WL1, WL2 and reading lines RL1, RL2, and TMR elements TMR1, TMR2 are provided in the crossing portions of the bit line BL and word lines WL1, WL2. By thus stacking TMR cells in vertical directions, it is possible to prevent the cell area from increasing even in the differential amplifying and multi-valued memories.

In FIGS. 18A and 18B, when reading is carried out, a current is caused to pass through the bit line BL, and a differential amplification is carried out by a sense amplifier provided on the terminals of the reading lines RL1, RL2. If the signal outputs of the TMR elements TMR1, TMR2 are changed, this architecture can carry out a multi-valued operation. Furthermore, in FIGS. 18A and 18B, the TMR elements TMR1, TMR2 are ferromagnetic single tunnel junctions.

In FIGS. 19A and 19B, various examples can be adopted with respect to the connecting relationship between the bit line BL, word lines WL1, WL2 and TMR elements C1, C2 as will be described later. For example, two bit lines for writing and reading may be provided to be connected to the TMR element. In addition, the word line WL is connected or is not connected to the TMR elements C1, C2.

The TMR elements C1, C2 have a storage layer. This storage layer has magnetization directions M1 and M2 which are substantially antiparallel to the magnetization fixed layer. Spin information is written in the storage layer in antiparallel and parallel to the direction of magnetization of the magnetization fixed layer of the magnetoresistive effect element, and a sense current passing through the bit line BL to pass through the TMR elements to carry out a differential amplification to determine "1" or "0". Furthermore, the TMR element C1 is a ferromagnetic single tunnel junction, and the TMR element C2 is a ferromagnetic double tunnel junction.

When a multi-valued recording is carried out, spin information is written in the storage layer in antiparallel and parallel to the direction of magnetization of the magnetization fixed layer of the TMR elements, and a sense current passing through the bit line BL to pass through the TMR elements to carry out a differential amplification to detect multi-valued information.

FIG. 18B also shows a writing method using a differential amplification type architecture in this embodiment, and the direction of spin of the TMR cell. In the case of the differential amplification type, an easy axis of the TMR element is preferably formed in a longitudinal direction of the word line WL. If the easy axis of the TMR element is formed in the longitudinal direction of the word line WL, the current pulse of the bit line BL is different from the direction of a magnetic field, which is applied to the upper and lower TMR elements, by about 180 degrees, so that writing can be simultaneously carried out in the upper and lower TMR cells, thereby allowing rapid writing.

FIG. 19B also shows a writing method using a multi-valued type architecture in this embodiment, and the direction of spin of an actual TMR cell. In the case of the multi-valued recording type architecture, an easy axis of the TMR element is preferably formed in a longitudinal direction of the bit line BL since information to be recorded must be optionally recorded in the upper and lower TMR elements. If the easy axis of the TMR element is formed in the longitudinal direction of the bit line BL, information can be optionally recorded in the upper and lower TMR elements by the word lines L1 and L2, so that multi-valued recording can be carried out.

Figures 20A, 20B:
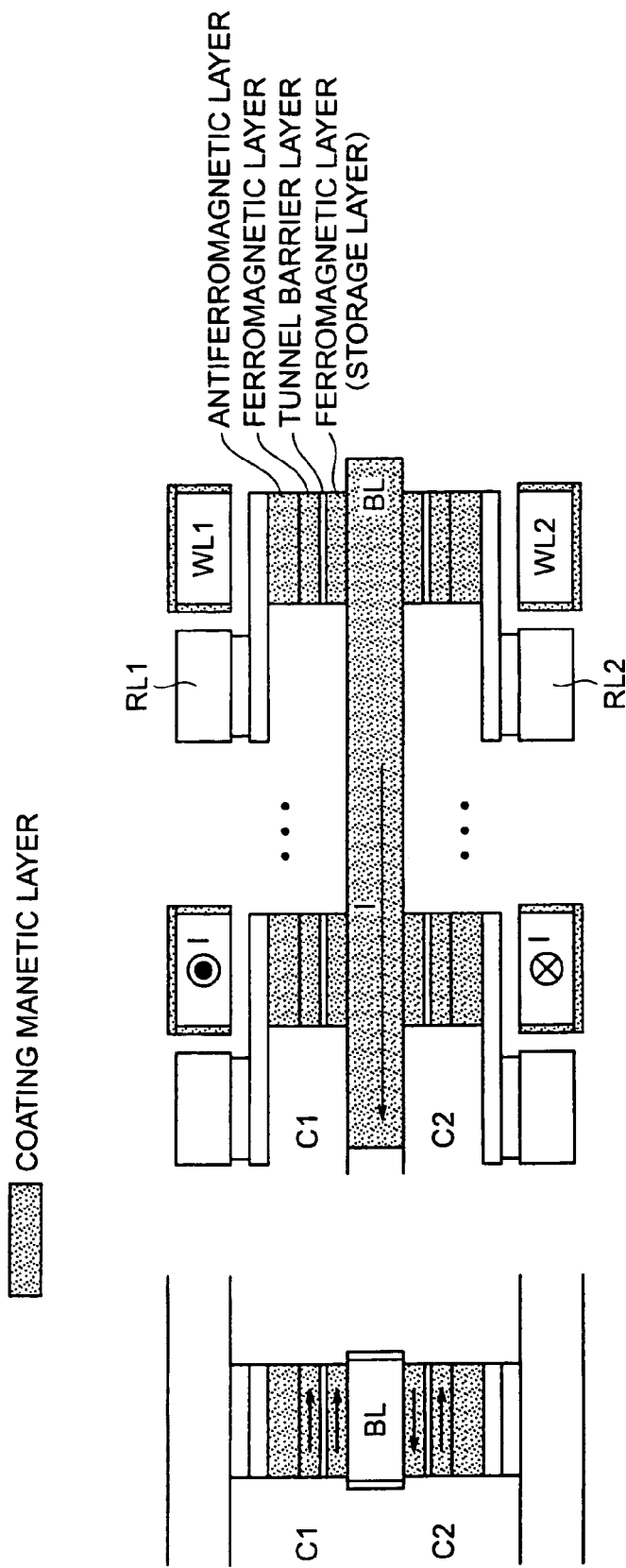
FIGS. 20A and 20B are front and side views of a seventh example of an architecture the magnetic memory in the third embodiment, respectively.

Furthermore, the architectures shown in FIGS. 14 and 17 can be stacked as a multi-layer to increase capacity. In addition, the above-described differential type or multi-valued type architecture, or an architecture formed by stacking them may be used. In that case, for example, as shown in FIGS. 20A and 20B, the bit line BL is preferably shared, and a magnetization coating line is preferably provided on the side wall of the shared bit line BL.

As described above, the magnetic memory in the third embodiment can achieve high integration and low power consumption since it uses a TMR element, which has a large MR ratio, excellent thermostability and a small switching magnetic field in the first or second embodiment, as a storage element.

As described above, according to the present invention, it is possible to obtain a magnetoresistive effect element which has a large MR ratio, excellent thermostability and a small switching magnetic field even if the size is decreased, and a magnetic memory using this magnetoresistive effect element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive effect element comprising:
    a storage layer formed by stacking a plurality of ferromagnetic layers via non-magnetic layers;
    a magnetization fixed film having at least one ferromagnetic layer; and
    a tunnel barrier layer provided between the storage layer and the magnetization fixed film,
    wherein each of the ferromagnetic layers of the storage layer is formed of an Ni—Fe—Co ternary alloy which has a composition selected from one of a composition region surrounded by a straight line of $Co_{90(at\ \%)}Fe_{10(at\ \%)}$—$Fe_{30(at\ \%)}Ni_{70(at\ \%)}$, a straight line of $Fe_{80(at\ \%)}Ni_{20(at\ \%)}$—$Fe_{30(at\ \%)}Ni_{70(at\ \%)}$ and a straight line of $Fe_{80(at\ \%)}Ni_{20(at\ \%)}$—$Co_{65(at\ \%)}Ni_{35(at\ \%)}$, and a composition region surrounded by a straight line of $Fe_{80(at\ \%)}Ni_{20(at\ \%)}$—$Co_{65(at\ \%)}Ni_{35(at\ \%)}$, a straight line of $Co_{90(at\ \%)}Fe_{10(at\ \%)}$—$Fe_{70(at\ \%)}Ni_{30(at\ \%)}$ and a straight line of $Co_{90(at\ \%)}Fe_{10(at\ \%)}$—$Fe_{30(at\ \%)}Ni_{70(at\ \%)}$,
    a peak-to-peak maximum surface roughness on each of an interface between the storage layer and the tunnel barrier layer and an interface between the magnetization fixed film and the tunnel baffler layer is 0.4 nm or less, and
    the magnetization fixed film has one of a three layer structure wherein a ferromagnetic layer, an amorphous magnetic layer, and a ferromagnetic layer are sequentially stacked, and a laminated structure wherein a ferromagnetic layer, an amorphous magnetic layer, a ferromagnetic layer, a non-magnetic layer, an amorphous magnetic layer, and a ferromagnetic layer are sequentially stacked.

2. A magnetoresistive effect element as set forth in claim 1, wherein the storage layer has one of a structure wherein a first ferromagnetic layer, a first non-magnetic layer and a second ferromagnetic layer are sequentially stacked, the first and second ferromagnetic layers being magnetically coupled to each other, and a structure wherein a first ferromagnetic layer, a first non-magnetic layer, a second ferromagnetic layer, a second non-magnetic layer and at third ferromagnetic layer are sequentially stacked, the first and second ferromagnetic layers being magnetically coupled to each other, and the second and third ferromagnetic layers being magnetically coupled to each other.

3. A magnetoresistive effect element as set forth in claim 1, wherein the magnetization fixed film is provided on an underlying metal layer, the underlying metal layer being formed of at least one element of Ta, Pt and Ru.

4. A magnetoresistive effect element as set forth in claim 1, wherein each of the ferromagnetic layers of the storage layer has a thickness of 1 nm to 3 nm.

5. A magnetoresistive effect element as set forth in claim 1, which further comprises an antiferromagnetic layer and wherein the magnetization fixed film is provided so as to contact the antiferromagnetic layer and the magnetization of the ferromagnetic layer of the magnetization fixed film is fixed by an exchange coupling force to the antiferromagnetic layer.

6. A magnetoresistive effect element as set forth in claim 1, wherein the ferromagnetic layer of the magnetization fixed film is formed of a binary alloy of Co—Fe.

7. A magnetoresistive effect element as set forth in claim 5, wherein the antiferromagnetic layer is formed of any one of $Pt_xMn_{1-x}$(49.5 at % $\leq x \leq$ 50.5 at %), $Ni_yMn_{1-y}$(49.5 at % $\leq y \leq$ 50.5 at %), and $Ir_zMn_{1-z}$ (22 at % $\leq z \leq$ 27 at %).

8. A magnetic memory comprising:
first lines;
second lines crossing the first lines;
memory cells, each of which is provided in a corresponding one of crossing regions between the first line and the second line,
wherein each of the memory cells has a magnetoresistive effect element, which is set forth in claim 1, as a storage element.

9. A magnetic memory as set forth in claim 8, wherein at least one of the first and second lines has a coating layer of a magnetically soft material on at least a side portion.

10. A magnetic memory comprising:
a first line;
a first magnetoresistive effect element formed above the first line;
a second magnetoresistive effect element formed below the first line;
a second line crossing the first line formed above the first magnetoresistive effect element; and
a third line crossing the first line formed below the second magnetoresistive effect element,
wherein each of said first and second magnetoresistive effect element is a magnetoresistive effect element as set forth in claim 1,
magnetization of a storage layer of each of the first and second magnetoresistive effect element is capable of being inverted in a predetermined direction by causing a current to pass through the first line while causing a current to pass through the second and third lines, and
a difference between output signals from the first and second magnetoresistive effect elements, which are obtained by causing a sense current to pass through the first and second magnetoresistive effect elements via the first line, is detected to be read as any one of binary information.

11. A magnetic memory as set forth in claim 10, wherein at least one of said second and third lines has a coating layer of a magnetically soft material on at least a side portion.

12. A magnetoresistive effect element comprising:
a storage layer formed by stacking a plurality of ferromagnetic layers via non-magnetic layers;
a magnetization fixed film having at least one ferromagnetic layer; and
a tunnel baffler layer provided between the storage layer and the magnetization fixed film,
wherein each of the ferromagnetic layers of the storage layer is formed of an Ni—Fe—Co ternary alloy which has a composition selected from one of a composition region surrounded by a straight line of $Co_{90(at\ \%)}Fe_{10(at\ \%)}$—$Fe_{30(at\ \%)}Ni_{70(at\ \%)}$, a straight line of $Fe_{80(at\ \%)}Ni_{20(at\ \%)}$—$Fe_{30(at\ \%)}Ni_{70(at\ \%)}$ and a straight line of $Fe_{80(at\ \%)}Ni_{20(at\ \%)}$—$Co_{65(at\ \%)}Ni_{35(at\ \%)}$, and a composition region surrounded by a straight line of $Fe_{80(at\ \%)}Ni_{20(at\ \%)}$—$CO_{65(at\ \%)}Ni_{35(at\ \%)}$, a straight line of $Co_{90(at\ \%)}Fe_{10(at\ \%)}$—$Fe_{70(at\ \%)}Ni_{30(at\ \%)}$ and a straight line of $Co_{90(at\ \%)}Fe_{10(at\ \%)}$—$Fe_{30(at\ \%)}Ni_{70(at\ \%)}$,
a peak-to-peak maximum surface roughness on each of an interface between the storage layer and the tunnel barrier layer and an interface between the magnetization fixed film and the tunnel barrier layer is 0.4 nm or less, and
the magnetization fixed film has a three layer structure wherein a ferromagnetic layer, a non-magnetic layer, and a ferromagnetic layer are sequentially stacked, and the ferromagnetic layer near the tunnel barrier layer is thicker than the ferromagnetic layer far from the tunnel barrier layer.

13. A magnetoresistive effect element as set forth in claim 12, wherein the ferromagnetic layers of the magnetization fixed film are antiferromagnetically coupled to each other.

14. A magnetoresistive effect element as set forth in claim 12, wherein the storage layer has one of a structure wherein a first ferromagnetic layer, a first non-magnetic layer and a second ferromagnetic layer are sequentially stacked, the first and second ferromagnetic layers being magnetically coupled to each other, and a structure wherein a first ferromagnetic layer, a first non-magnetic layer, a second ferromagnetic layer, a second non-magnetic layer and a third ferromagnetic layer are sequentially stacked, the first and second ferromagnetic layers being magnetically coupled to each other, and the second and third ferromagnetic layers being magnetically coupled to each other.

15. A magnetoresistive effect element as set forth in claim 12, wherein the magnetization fixed film is provided on an underlying metal layer, the underlying metal layer being formed of at least one element of Ta, Pt and Ru.

16. A magnetoresistive effect element as set forth in claim 12, wherein each of the ferromagnetic layers of the storage layer has a thickness of 1 nm to 3 nm.

17. A magnetoresistive effect element as set forth in claim 12, which further comprises an antiferromagnetic layer and wherein the magnetization fixed film is provided so as to contact the antiferromagnetic layer and the magnetization of the ferromagnetic layer of the magnetization fixed film is fixed by an exchange coupling force to the antiferromagnetic layer.

18. A magnetoresistive effect element as set forth in claim 12, wherein the ferromagnetic layer of the magnetization fixed film is formed of a binary alloy of Co—Fe.

19. A magnetoresistive effect element as set forth in claim 17, wherein the antiferromagnetic layer is formed of any one of $Pt_xMn_{1-x}$(49.5 at % $\leq x \leq$ 50.5 at %), $Ni_yMn_{1-y}$(49.5 at % $\leq y \leq$ 50.5 at %), and $Ir_zMn_{1-z}$(22 at % $\leq z \leq$ 27 at %).

20. A magnetic memory comprising:
first lines;
second lines cross the first lines;
memory cells, each of which is provided in a corresponding one of crossing regions between the first line and the second line,
wherein each of the memory cells has a magnetoresistive effect element, which is set forth in claim 12, as a storage element.

21. A magnetic memory as set forth in claim 20, wherein at least one of the first and second lines has a coating layer of a magnetically soft material on at least a side portion.

22. A magnetic memory comprising:
a first line;
a first magnetoresistive effect element formed above the first line;
a second magnetoresistive effect element formed below the first line;
a second line crossing the first line formed above the first magnetoresistive effect element; and
a third line crossing the first line formed below the second magnetoresistive effect element,
wherein each of said first and second magnetoresistive effect element is a magnetoresistive effect element as set forth in claim 12,
magnetization of a storage layer of each of the first and second magnetoresistive effect element is capable of being inverted in a predetermined direction by causing a current to pass through the first line while causing a current to pass through the second and third lines, and
a difference between output signals from the first and second magnetoresistive effect elements, which are obtained by causing a sense current to pass through the first and second magnetoresistive effect elements via the first line, is detected to be read as any one of binary information.

23. A magnetic memory as set forth in claim 22, wherein at least one of said second and third lines has a coating layer of a magnetically soft material on at least a side portion.

24. A magnetoresistive effect element comprising:
a magnetization fixed film having at least one ferromagnetic layer;
a tunnel barrier layer provided on the magnetization fixed film,
a storage layer provided on the tunnel barrier layer and formed by stacking a plurality of ferromagnetic layers via non-magnetic layers;
wherein each of the ferromagnetic layers of the storage layer is formed of an Ni—Fe—Co ternary alloy which has a composition selected from one of a composition region surrounded by a straight line of $Co_{90(at\ \%)}Fe_{10(at\ \%)}$—$Fe_{30(at\ \%)}Ni_{70(at\ \%)}$, a straight line of $Fe_{80(at\ \%)}Ni_{20(at\ \%)}$—$Fe_{30(at\ \%)}Ni_{70(at\ \%)}$ and a straight line of $Fe_{80(at\ \%)}Ni_{20(at\ \%)}$—$Co_{65(at\ \%)Ni35(at\ \%)}$, and a composition region surrounded by a straight line of $Fe_{80(at\ \%)}Ni_{20(at\ \%)}$—$Co_{65(at\ \%)}Ni_{35(at\ \%)}$, a straight line of $Co_{90(at\ \%)}Fe_{10(at\ \%)}$—$Fe_{70(at\ \%)}Ni_{30(at\ \%)}$ and a straight line of $Co_{90(at\ \%)}Fe_{10(at\ \%)}$—$Fe_{30(at\ \%)}Ni_{70(at\ \%)}$, and
a peak-to-peak maximum surface roughness on each of an interface between the storage layer and the tunnel barrier layer and an interface between the magnetization fixed film and the tunnel barrier layer is 0.4 nm or less.

25. A magnetoresistive effect element as set forth in claim 24, wherein the storage layer has one of a structure wherein a first ferromagnetic layer, a first non-magnetic layer and a second ferromagnetic layer are sequentially stacked, the first and second ferromagnetic layers being magnetically coupled to each other, and a structure wherein a first ferromagnetic layer, a first non-magnetic layer, a second ferromagnetic layer, a second non-magnetic layer and a third ferromagnetic layer are sequentially stacked, the first and second ferromagnetic layers being magnetically coupled to each other, and the second and third ferromagnetic layers being magnetically coupled to each other.

26. A magnetoresistive effect element as set forth in claim 24, wherein the magnetization fixed film is provided on an underlying metal layer, the underlying metal layer being formed of at least one element of Ta, Pt and Ru.

27. A magnetoresistive effect element as set forth in claim 24, wherein the magnetization fixed film has a structure wherein a non-magnetic layer is sandwiched between ferromagnetic layers, the ferromagnetic layers sandwiching the non-magnetic layer being antiferromagnetically coupled to each other.

28. A magnetoresistive effect element as set forth in claim 24, wherein each of the ferromagnetic layers of the storage layer has a thickness of 1 nm to 3 nm.

29. A magnetoresistive effect element as set forth in claim 24, which further comprises an antiferromagnetic layer and wherein the magnetization fixed film is provided so as to contact the antiferromagnetic layer and the magnetization of the ferromagnetic layer of the magnetization fixed film is fixed by an exchange coupling force to the antiferromagnetic layer.

30. A magnetoresistive effect element as set forth in claim 24, wherein the ferromagnetic layer of the magnetization fixed film is formed of a binary alloy of Co—Fe.

31. A magnetoresistive effect element as set forth in claim 29, wherein the antiferromagnetic layer is formed of any one of $Pt_xMn_{1-x}$ (49.5 at % $\leq x \leq$ 50.5 at %), $Ni_yMn_{1-y}$ (49.5 at % $\leq y \leq$ 50.5 at %), and $Ir_zMn_{1-z}$ (22 at % $\leq z \leq$ 27 at %).

32. A magnetic memory comprising:
first lines;
second lines crossing the first lines;
memory cells, each of which is provided in a corresponding one of crossing regions between the first line and the second line,
wherein each of the memory cells has a magnetoresistive effect element, which is set forth in claim 24, as a storage element.

33. A magnetic memory as set forth in claim 32, wherein at least one of the first and second lines has a coating layer of a magnetically soft material on at least a side portion.

34. A magnetic memory comprising:
a first line;
a first magnetoresistive effect element formed above the first line;
a second magnetoresistive effect element formed below the first line;
a second line crossing the first line formed above the first magnetoresistive effect element; and
a third line crossing the first line formed below the second magnetoresistive effect element,
wherein each of said first and second magnetoresistive effect element is a magnetoresistive effect element as set forth in claim 24,
magnetization of a storage layer of each of the first and second magnetoresistive effect element is capable of being inverted in a predetermined direction by causing a current to pass through the first line while causing a current to pass through the second and third lines, and a difference between output signals from the first and second magnetoresistive effect elements, which are obtained by causing a sense current to pass through the first and second magnetoresistive effect elements via the first line, is detected to be read as any one of binary information.

35. A magnetic memory as set forth in claim 34, wherein at least one of said second and third lines has a coating layer of a magnetically soft material on at least a side portion.

* * * * *